(12) United States Patent
Kim et al.

(10) Patent No.: US 11,233,312 B2
(45) Date of Patent: Jan. 25, 2022

(54) ANTENNA DEVICE HAVING SLIT STRUCTURE AND ELECTRONIC DEVICE INCLUDING THE SAME

(71) Applicant: Samsung Electronics Co., Ltd., Gyeonggi-do (KR)

(72) Inventors: Jaehyung Kim, Gyeonggi-do (KR); Sang-Min Han, Gyeonggi-do (KR); Kyung-Bae Ko, Gyeonggi-do (KR); Youngjung Kim, Seoul (KR); Jong-Suk Kim, Gyeonggi-do (KR); Taegyu Kim, Gyeonggi-do (KR); Jinkyu Bang, Gyeonggi-do (KR); Changha Yu, Gyeonggi-do (KR); Young-Sung Lee, Gyeonggi-do (KR)

(73) Assignee: Samsung Electronics Co., Ltd.

( * ) Notice: Subject to any disclaimer, the term of this patent is extended or adjusted under 35 U.S.C. 154(b) by 302 days.

(21) Appl. No.: 15/922,466

(22) Filed: Mar. 15, 2018

(65) Prior Publication Data

US 2018/0269561 A1 Sep. 20, 2018

(30) Foreign Application Priority Data

Mar. 15, 2017 (KR) .................. 10-2017-0032324

(51) Int. Cl.
*H01Q 1/24* (2006.01)
*H01Q 13/10* (2006.01)
(Continued)

(52) U.S. Cl.
CPC ............ *H01Q 1/243* (2013.01); *H01Q 1/085* (2013.01); *H01Q 1/36* (2013.01); *H01Q 1/44* (2013.01);
(Continued)

(58) Field of Classification Search
CPC ........... H01Q 1/243; H01Q 13/10; H01Q 1/44
See application file for complete search history.

(56) References Cited

U.S. PATENT DOCUMENTS 7,535,431 B2 * 5/2009 Rowell .................. H01Q 1/243
343/846
9,559,425 B2 * 1/2017 Zhu .......................... G01V 3/00
(Continued)

FOREIGN PATENT DOCUMENTS

| CN | 101304121 | 11/2008 |
|---|---|---|
| CN | 104701618 | 6/2015 |
| KR | 1020170019838 | 2/2017 |

OTHER PUBLICATIONS

European Search Report dated Aug. 10, 2018 issued in counterpart application No. 18162022.0-1205, 9 pages.
(Continued)

*Primary Examiner* — Dameon E Levi
*Assistant Examiner* — Jennifer F Hu
(74) *Attorney, Agent, or Firm* — The Farrell Law Firm, P.C.

(57) ABSTRACT

An electronic device includes housing including first plate, second plate, and side member, wherein side member includes first side face in first direction having first length, second side face having second length greater than first length, third side face extending parallel to first side face having first length, and fourth side face; touch screen display disposed within housing, and exposed through portion of first plate; a PCB between first plate and second plate to be parallel to second plate, wherein PCB includes ground plane and first L-shaped ground extension between first conductive region of second plate and first plate, and first L-shaped ground extension includes first portion extending in second direction from ground plane and second portion extending in first direction from first portion; and at least one first
(Continued)

wireless communication circuit disposed on PCB and electrically connected to first point in second portion of first L-shaped ground extension.

19 Claims, 33 Drawing Sheets

(51) Int. Cl.
    *H01Q 1/44*     (2006.01)
    *H01Q 21/30*     (2006.01)
    *H01Q 1/48*     (2006.01)
    *H01Q 1/08*     (2006.01)
    *H01Q 1/36*     (2006.01)
    *H03K 17/96*     (2006.01)

(52) U.S. Cl.
    CPC .............. *H01Q 1/48* (2013.01); *H01Q 13/10* (2013.01); *H01Q 21/30* (2013.01); *H03K 17/96* (2013.01)

(56) References Cited

U.S. PATENT DOCUMENTS

| | | | | |
|---|---|---|---|---|
| 9,614,276 | B2* | 4/2017 | Pinto | H01Q 21/28 |
| 2008/0231521 | A1* | 9/2008 | Anguera Pros | H01Q 9/0421 |
| | | | | 343/702 |
| 2013/0057437 | A1* | 3/2013 | Chiu | H01Q 5/328 |
| | | | | 343/702 |
| 2013/0207855 | A1* | 8/2013 | Chien | H01Q 13/10 |
| | | | | 343/721 |
| 2014/0125528 | A1* | 5/2014 | Tsai | H01Q 13/106 |
| | | | | 343/702 |
| 2015/0070219 | A1 | 3/2015 | Dinh et al. | |
| 2015/0270619 | A1* | 9/2015 | Zhu | G01V 3/00 |
| | | | | 343/702 |
| 2015/0311594 | A1* | 10/2015 | Zhu | H01Q 21/28 |
| | | | | 343/702 |
| 2016/0072178 | A1* | 3/2016 | Khalifa | H01Q 1/36 |
| | | | | 343/702 |
| 2016/0285167 | A1* | 9/2016 | Tsai | H01Q 9/42 |
| 2016/0336643 | A1* | 11/2016 | Pascolini | H01Q 9/0421 |
| 2017/0047637 | A1* | 2/2017 | Kim | H01Q 1/243 |
| 2017/0244154 | A1* | 8/2017 | Chou | H01Q 1/243 |

OTHER PUBLICATIONS

Chinese Office Action dated Jul. 16, 2020 issued in counterpart application No. 201810213294.4, 22 pages.
Korean Office Action dated Feb. 24, 2021 issued in counterpart application No. 10-2017-0032324, 12 pages.
KR Notice of Patent Grant dated Aug. 26, 2021 issued in counterpart application No. 10-2017-0032324, 4 pages.

* cited by examiner

ANTENNA DEVICE HAVING SLIT STRUCTURE AND ELECTRONIC DEVICE INCLUDING THE SAME

CROSS-REFERENCE TO RELATED APPLICATION(S)

This application is based on and claims priority under 35 U.S.C. § 119 to Korean Patent Application No. 10-2017-0032324, filed on Mar. 15, 2017, in the Korean Intellectual Property Office, the disclosure of which is incorporated by reference herein in its entirety.

BACKGROUND

1) Field

The present disclosure relates generally to an antenna device having a slit structure and an electronic device including the same and, more particularly, to an antenna device and an electronic device having the antenna device, in which the antenna device has a slit structure, which is implemented to be capable of operating in multi-bands in the antenna device, which uses a non-conductive slit formed in a housing and a slit formed in a printed circuit board (PCB).

2) Description of Related Art

The above information is presented as background information only to assist with an understanding of the present disclosure. No determination has been made, and no assertion is made, as to whether any of the above might be applicable as prior art with regard to the present disclosure.

Recently, as the functional gap between electronic devices of respective manufacturers has been considerably reduced, electronic devices have become increasingly slimmer in order to meet consumer purchasing needs, and development has been carried out in order to increase the rigidity of the electronic devices, to strengthen the design aspect of the electronic devices, and to slim the electronic devices.

Electronic devices support various wireless communication services such as long term evolution (LTE), wireless fidelity (WiFi), near field communication (NFC), and Bluetooth (BT). Electronic devices may include at least one antenna device in order to support various frequencies of various wireless communication services.

In antenna devices, the volume and number of the antenna radiators to be mounted may be determined depending on the frequency, bandwidth, and type of each service. The antenna devices typically may use, for example, a low band of 700 MHz to 900 MHz, a mid band of 1700 MHz to 2200 MHz, and a high band of 2200 MHz to 2700 MHz as main communication bands. For example, various wireless communication services (e.g., BT, global positioning system (GPS), and WiFi) may be used. In order to support the above-mentioned communication bands, a plurality of antenna radiators is required. However, electronic devices have a limited volume of space for an antenna. In order to overcome this issue, an antenna may be designed in such a manner that service bands having similar frequency bands may be bundled.

For example, in the case of antenna devices allocated to voice/data communication (e.g., general packet radio service (GPRS), wideband code division multiple access (WCDMA), or light emitting diode (LED)) that is a main function of an electronic device for communication, by European standards, bands to be implemented may be implemented by about 24 bands including second generation (2G) (global system for mobile communications 850 (GSM850), extended GSM (EGSM), distributed control system (DCS), personal communication system (PCS)), WCDMA (B1, B2, B5, B8), and LTE (B1, B2, B3, B4, B5, B7, B8, B12, B17, B18, B19, B20, B26, B38, B39, B40, B41). It is difficult to satisfy a provider's specification and an electromagnetic wave absorption rate (specific absorption rate (SAR)) standard or to minimize an effect on a human body while implementing the above-mentioned bands in one antenna device. Accordingly, an antenna device may be implemented by bundling service bands having similar frequency bands in at least two regions. For example, 2G (GSM850, EGSM, DCS, PCS), WCDMA (B1, B2, B5, B8) and LTE (B1, B2, B3, B4, B5, B8, B12, B17, B18, B19, B20, B26, B39) may be implemented in one antenna, and an antenna for LTE (B7, B38, B40, B41) may be designed in another antenna.

When a housing of an electronic device is configured with a metallic member, an antenna device may operate using at least one non-conductive slit disposed across the width direction of the housing. In this case, the antenna device may perform a smooth radiation action by a slit formed in the region of a PCB which is disposed inside the electronic device and overlaps the non-conductive slit in the housing, and the operating frequency band may be changed depending on the length of the slit.

However, an antenna device using a slit (e.g., a board slit) in a PCB and a non-conductive slit in a housing may control one frequency operating band according to the length of the slit, but may not operate in multiple frequency bands.

In addition, when a plurality of antenna power-feeding portions is added in order to form multi-band resonance, an isolation issue may occur between antennas using a slit as a radiator, so that radiation performance may deteriorate.

In addition, an antenna device, which operates using a non-conductive slit extending across both ends in a width direction of an electronic device and a slit in the PCB, may be degraded in radiation performance when the electronic device is gripped (e.g., a hand effect).

SUMMARY

An aspect of the present disclosure provides an antenna device and an electronic device including the antenna device, in which the antenna device has a slit structure, which is configured to prevent degradation of the performance of the antenna device even if the housing of the electronic device is formed using a metallic member.

Another aspect of the present disclosure provides an antenna device and an electronic device having the antenna device, in which the antenna device has a slit structure, which is implemented to be capable of operating in multi-bands in the antenna device, which uses a non-conductive slit formed in a housing and a slit formed in a PCB.

Another aspect of the present disclosure provides an antenna device and an electronic device having the antenna device, in which the antenna device has a slit structure in which degradation of radiation performance at the time of gripping the electronic device (e.g., the hand effect) may be reduced.

According to an embodiment, there is provided an electronic device. The electronic device includes a housing having a first plate, a second plate facing away from the first plate, and a side member surrounding a space between the first plate and the second plate, wherein the side member includes a first side face extending in a first direction and having a first length, a second side face extending in a second direction perpendicular to the first direction and having a second length greater than the first length, a third side face extending parallel to the first side face and having the first length, and a fourth side face extending parallel to the second side face and having the second length, wherein the first side face includes a first conductive portion, a first non-conductive portion, a second conductive portion, a second non-conductive portion, and a third conductive portion sequentially disposed between the second side face and the fourth side face, and wherein the second plate is formed of a conductive material, and comprises a non-conductive slit surrounding the first conductive region together with the second conductive portion when viewed from an upper side of the second plate, the non-conductive slit extending from the first non-conductive portion to the second non-conductive portion; a touch screen display disposed within the housing, and exposed through a portion of the first plate; a PCB disposed between the first plate and the second plate to be parallel to the second plate, wherein the PCB includes a main ground plane and a first L-shaped ground extension disposed between the first conductive region of the second plate and the first plate, and the first L-shaped ground extension comprises a first portion extending generally in the second direction from the main ground plane and a second portion extending generally in the first direction from the first portion; and at least one first wireless communication circuit disposed on the PCB and electrically connected to a first point in the second portion of the first L-shaped ground extension.

BRIEF DESCRIPTION OF THE DRAWINGS

The above and other aspects, features, and advantages of the present disclosure will be more apparent from the following description, taken in conjunction with the accompanying drawings, in which.

DETAILED DESCRIPTION OF EMBODIMENTS OF THE PRESENT DISCLOSURE

Figure 1:
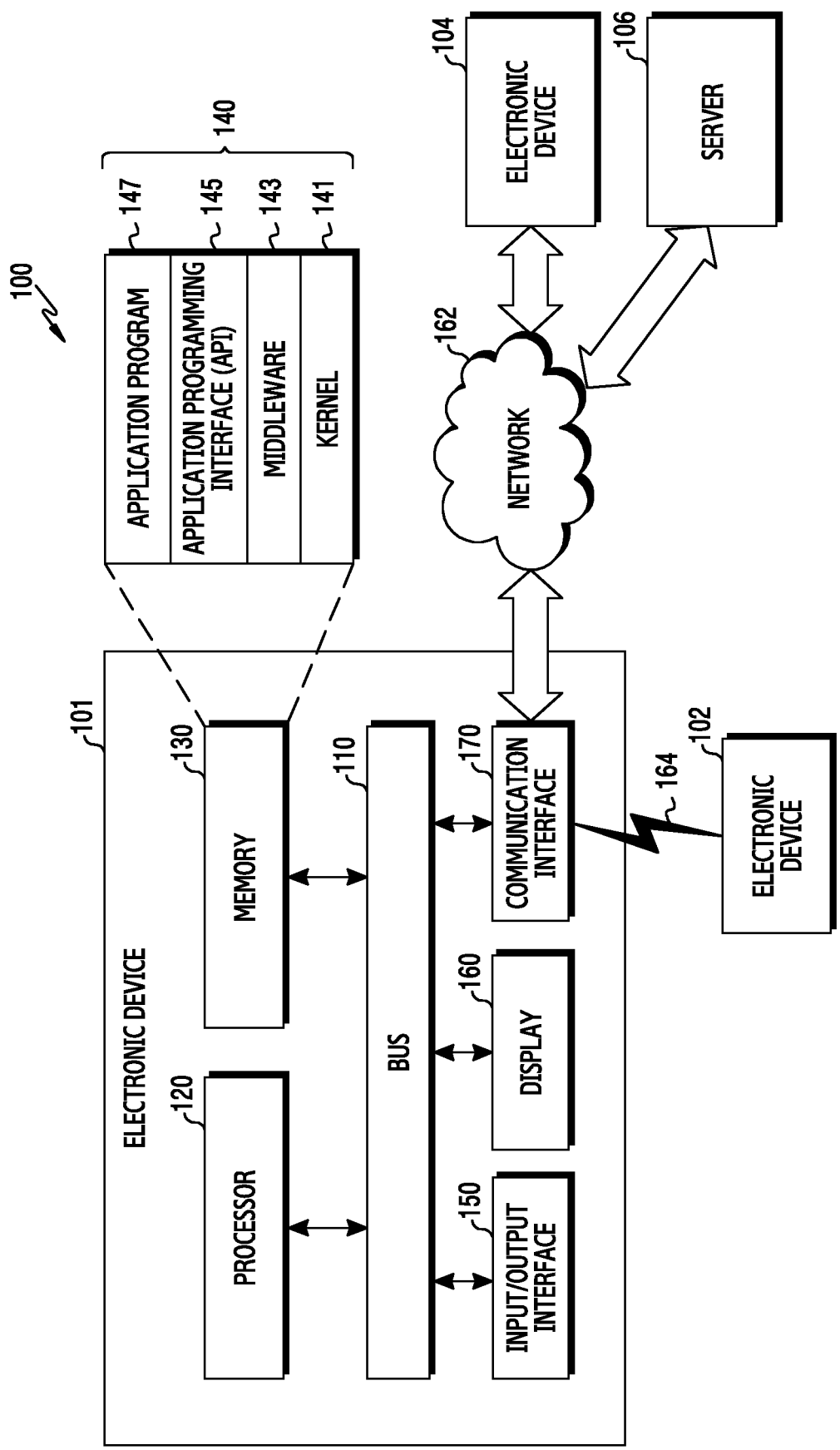
FIG. 1 is a block diagram of a network environment that includes an electronic device according to an embodiment of the present disclosure.

Embodiments of the present disclosure are described below in greater detail with reference to the accompanying drawings, in which similar reference numerals may be used to refer to similar elements. In the following description, certain details such as detailed configuration and components are merely provided to assist in the overall understanding of the present disclosure. Therefore, it should be apparent to those skilled in the art that various changes and modifications of the embodiments described herein may be made without departing from the scope and spirit of the present disclosure. For example, those skilled in the art will understand that the principles of the present disclosure may be implemented in any suitably arranged electronic device.

In addition, descriptions of well-known functions and constructions may be omitted for clarity and conciseness.

The terms and words used in the present disclosure are not intended to be limited to their dictionary meanings, but are used to convey a clear and consistent understanding of the present disclosure. Accordingly, it should be apparent to those skilled in the art that the following description of the present disclosure is provided for illustrative purposes only and not for the purpose of limiting the scope of the present disclosure, as defined by the appended claims and their equivalents.

Singular terms such as "a," "an," and "the" include plural references unless the context clearly dictates otherwise. Thus, for example, "a component surface" includes reference to one or more of such surfaces.

Herein, terms such as "have," "may have," "include," and "may include" refer to the presence of corresponding features (e.g., elements such as numerical values, functions, operations, or parts), but do not preclude the presence of additional features.

The terms "A or B," "at least one of A and/or B," and "one or more of A and/or B" include all possible combinations of the enumerated items. For example, "A or B," "at least one of A and B," and "at least one of A or B" indicates (1) at least one A, (2) at least one B, and (3) at least one A and at least one B.

Numerical terms, such as "first" and "second", may modify various elements regardless of an order and/or importance of the elements, but are not intended to limit the elements. These terms may be used for the purpose of distinguishing one element from another element. For example, a first user device and a second user device may indicate different user devices, regardless of the order or importance of the devices. Accordingly, a first element may be referred to as a second element, and similarly, a second element may be referred to as a first element, without departing from the scope of the present disclosure.

When an element (e.g., a first element) is "(operatively or communicatively) coupled with/to" or "connected to" another element (e.g., a second element), the first element may be directly "coupled with/to" the second element, or there may be an intervening element (e.g., a third element) between the first element and the second element. However, when the first element is "directly coupled with/to" or "directly connected to" the second element, there is no intervening element therebetween.

Herein, the term "module" may refer to a unit including one of hardware, software, firmware, and any combination thereof. The term "module" may be interchangeably used with terms, such as "unit," "logic," "logical block," "component," and "circuit." A module may be a minimum unit of an integrally constituted component or may be a part thereof. A module may be a minimum unit for performing one or more functions or may be a part thereof. A module may be mechanically or electrically implemented. For example, a module may include at least one of a dedicated processor, a central processing unit (CPU), an application-specific integrated circuit (ASIC) chip, a field-programmable gate array (FPGA), and a programmable-logic device, which are known or will be developed and which perform certain operations.

All of the terms used herein, have the same meanings as those generally understood by a person having ordinary skill in the related art unless they are defined otherwise. Terms defined in a generally used dictionary should be interpreted as having the same or similar meanings as the contextual meanings of the relevant technology but should not be interpreted as having ideal or exaggerated meanings unless clearly defined as such herein. Even terms defined in the present disclosure should not be interpreted as excluding embodiments of the present disclosure.

Example electronic devices may include smart phones, tablet personal computers (PCs), mobile phones, video telephones, electronic book readers, desktop PCs, laptop PCs, netbook computers, workstations, servers, personal digital assistants (PDAs), portable multimedia players (PMPs), motion picture experts group (MPEG-1 or MPEG-2) audio layer 3 (MP3) players, mobile medical devices, cameras, and/or wearable devices, or the like, but are not limited thereto. For example, wearable devices may include accessory-type wearable devices (e.g., watches, rings, bracelets, anklets, necklaces, glasses, contact lenses, or head-mounted-devices (HMDs)), fabric or clothing integral wearable devices (e.g., electronic clothes), body-mounted wearable devices (e.g., skin pads or tattoos), and/or implantable wearable devices (e.g., implantable circuits), or the like but are not limited thereto.

Electronic devices may include smart home appliances, such as televisions (TVs), digital versatile disk (DVD) players, audio players, refrigerators, air conditioners, cleaners, ovens, microwave ovens, washing machines, air cleaners, set-top boxes, home automation control panels, security control panels, TV boxes (e.g., Samsung HomeSync®, Apple TV®, or Google TV™), game consoles (e.g., Xbox® and PlayStation®), electronic dictionaries, electronic keys, camcorders, and/or electronic picture frames, or the like, but are not limited thereto.

Electronic devices may include a medical device, such as a portable medical measurement device (e.g., a blood glucose meter, a heart rate monitor, a blood pressure monitor, or a thermometer), a magnetic resonance angiography (MRA) device, a magnetic resonance imaging (MRI) device, a computed tomography (CT) device, a scanner, an ultrasonic device, a navigation device, a GPS receiver, an event data recorder (EDR), a flight data recorder (FDR), a vehicle infotainment device, electronic equipment for a vessel (e.g., navigation systems, gyrocompasses, etc.), an avionic device, a security device, a head unit for a vehicle, an industrial or home robot, an automated teller machine (ATM), a point of sale (POS) device, and/or an Internet of Things (IoT) device (e.g., a light bulb, a sensor, an electric or gas meter, a sprinkler device, a fire alarm, a thermostat, a street lamp, a toaster, exercise equipment, a hot water tank, a heater, or a boiler).

An electronic device may also include a part of furniture or building/structure, electronic board, electronic signature receiving device, projector, or measuring instrument (e.g., a water meter, an electricity meter, a gas meter, or a wave meter).

An electronic device may be a flexible electronic device.

An electronic device may be a combination of the above-described devices.

Additionally, an electronic device of the present disclosure is not limited to the above-described devices, but may include a newly developed electronic device.

Herein, the term "user" may refer to a person who uses an electronic device or a device (e.g., an artificial intelligence (AI) electronic device) which uses an electronic device.

FIG. 1 is a block diagram of a network environment 100 including an electronic device 101, according to an embodiment of the present disclosure.

Referring to FIG. 1, the network environment 100 includes the electronic device 101, which includes a bus 110, a processor (e.g., including processing circuitry) 120, a memory 130, an input/output interface (e.g., including input/output circuitry) 150, a display 160, and a communication interface (e.g., including communication circuitry) 170. Alternatively, the electronic device 101 may omit at least one of the illustrated components and/or include additional components.

The bus 110 is a circuit for connecting the components 120 through 170 and delivering communications such as a control message therebetween.

The processor 120 may include various processing circuitry, such as at least one of a dedicated processor, a CPU, an application processor (AP), and/or a communication processor (CP). The processor 120 processes an operation or data on control of and/or communication with another component of the electronic device 101.

The processor 120 may also include a microprocessor or any suitable type of processing circuitry, such as one or more general-purpose processors (e.g., advanced reduced instruction set (ARM) based processors), a digital signal processor (DSP), a programmable logic device (PLD), an ASIC, a field-programmable gate array (FPGA), a graphics processing unit (GPU), a video card controller, etc. In addition, when a general purpose computer accesses code for implementing the processing described herein, the execution of the code transforms the general purpose computer into a special purpose computer for executing the processing described herein.

The processor 120, which may be connected to an LTE network, may determine whether a call is connected over a circuit switched (CS) service network using caller identification information, such as a caller phone number of the CS service network, e.g., a 2G or a 3rd generation (3G) network. For example, the processor 120 receives incoming call information, such as a CS notification message or a paging request message of the CS service network over the LTE network, such as circuit-switched fallback (CSFB). The processor 120 being connected to the LTE network receives incoming call information, such as a paging request message over the CS service network, such as single radio LTE (SRLTE).

When receiving an incoming CS notification message or a paging request message of the CS service network over the LTE network, the processor 120 may obtain caller identification information from the incoming call information. The processor 120 may display the caller identification information on the display 160. The processor 120 may determine whether to connect the call based on input information corresponding to the caller identification information displayed on the display 160. For example, when detecting input information corresponding to an incoming call rejection, through the input/output interface 150, the processor 120 may restrict the voice call connection and maintain the LTE network connection. When detecting input information corresponding to an incoming call acceptance, through the input/output interface 150, the processor 120 may connect the voice call by connecting to the CS service network.

When receiving the incoming CS notification message or a paging request message of the CS service network over the LTE network, the processor 120 may obtain caller identification information from the incoming call information. The processor 120 may determine whether to connect the call by comparing the caller identification information with a reception control list. For example, when the caller identification information is included in a first reception control list, such as a blacklist, the processor 120 may restrict the voice call connection and maintain the connection to the LTE network. When the caller identification information is not included in the blacklist, the processor 120 may connect the voice call by connecting to the CS service network. When the caller identification information is included in a second reception control list, such as a white list, the processor 120 may connect the voice call by connecting to the CS service network.

When receiving the incoming call information, such as a paging request message of the CS service network over the LTE network, the processor 120 may send an incoming call response message, such as a paging response message, to the CS service network. The processor 120 may suspend the LTE service and receive the caller identification information, such as a circuit-switched call (CC) setup message, from the CS service network. The processor 120 may determine whether to connect the call by comparing the caller identification information with the reception control list. For example, when the caller identification information is included in the blacklist, the processor 120 restricts the voice call connection and resumes the LTE network connection. When the caller identification information is not included in the the blacklist, the processor 120 may connect the voice call by connecting to the CS service network. For example, when the caller identification information is included in the white list, the processor 120 connects the voice call by connecting to the CS service network.

The memory 130 may include volatile and/or nonvolatile memory. The memory 130 may store commands or data, such as the reception control list relating to the other components of the electronic device 101. The memory 130 may store software and/or a program 140. The program 140 includes a kernel 141, middleware 143, an application programming interface (API) 145, and/or an application program (or applications) 147. At least some of the kernel 141, the middleware 143, and the API 145 may be referred to as an operating system (OS).

The kernel 141 may control or manage system resources, such as the bus 110, the processor 120, or the memory 130, used for performing an operation or function implemented by the other programs, such as the middleware 143, the API 145, or the application program 147. Further, the kernel 141 may provide an interface for allowing the middleware 143, the API 145, or the application program 147 to access individual elements of the electronic device 101 to control or manage the system resources.

The middleware 143 may function as an intermediary for the API 145 or the application program 147 to communicate with the kernel 141, e.g., to exchange data.

In addition, the middleware 143 may process one or more task requests received from the application program 147 according to priorities thereof. For example, the middleware 143 assigns priorities for using the system resources of the electronic device 101, to at least one of the applications in the application program 147. For example, the middleware 143 performs scheduling or load balancing on the one or more task requests by processing the one or more task requests according to the priorities assigned thereto.

The API 145 is an interface through which the application program 147 may control functions provided from the kernel 141 or the middleware 143, and may include at least one interface or function, such as an instruction for file control, window control, image processing, or text control.

The input/output interface 150 may include various input/output circuitry and function as an interface that transfers instructions or data input from a user or another external device to the other elements of the electronic device 101. Further, the input/output interface 150 may output the instructions or data received from the other elements of the electronic device 101 to the user or an external electronic device.

The display 160 may include a liquid crystal display (LCD), an LED display, an organic LED (OLED) display, a micro electro mechanical system (MEMS) display, an electronic paper display, or the like, but is not limited thereto.

The display 160 may display various types of content, such as text, images, videos, icons, or symbols. The display 160 may display a web page.

The display 160 may include a touch screen, which receives a touch, a gesture, proximity, a hovering input, etc., using an electronic pen or a user's body part (e.g., a finger).

The communication interface 170 may include various communication circuitry and establish communication between the electronic device 101 and a first external electronic device 102, a second external electronic device 104, and/or a server 106. For example, the communication interface 170 communicates with the first external electronic device 102, the second external electronic device 104, and/or the server 106 through the network 162 using wireless communication or wired communication or via a short-range communication 164. For example, the wireless communication conforms to a cellular communication protocol including at least one of LTE, LTE-advanced (LTE-A), code division multiple access (CDMA), WCDMA, universal mobile telecommunication system (UMTS), wireless broadband (WiBro), and GSM.

The wired communication may include at least one of a universal serial bus (USB), a high definition multimedia interface (HDMI), a recommended standard 232 (RS-232), and a plain old telephone service (POTS).

The network 162 may include a telecommunications network, a computer network such as local area network (LAN) or wide area network (WAN), the Internet, and a telephone network.

The electronic device 101 may provide an LTE service in a single radio environment by use of at least one module functionally or physically separated from the processor 120.

Each of the first and second external electronic devices 102 and 104 may be the same or different type of device as the electronic device 101.

The server 106 may include a group of one or more servers.

All or some of the operations to be executed by the electronic device 101 may be executed by the first external electronic device 102, the second external electronic device 104, and/or the server 106. For example, when the electronic device 101 performs a certain function or service (automatically or by request), the electronic device 101 may request some functions that are associated therewith from the first external electronic device 102, the second external electronic device 104, and/or the server 106, instead of, or in addition to, executing the function or service itself. The first external electronic device 102, the second external electronic device 104, and/or the server 106 may execute the requested functions or additional functions, and may transmit the results to the electronic device 101. The electronic device 101 may provide the requested functions or services by processing the received results. For example, a cloud computing technique, a distributed computing technique, or a client-server computing technique may be used.

According to an embodiment of the present disclosure, the processor 120 may determine a current mode of the electronic device based on a result detected in at least one of the above-described sensor modules according to an embodiment of the present disclosure. The processor 120 may generate a control signal based on the determined current mode, and may adjust an operating frequency band of a conductive member of the electronic device in a low band by controlling a tunable circuit using the corresponding control signal.

Figure 2:
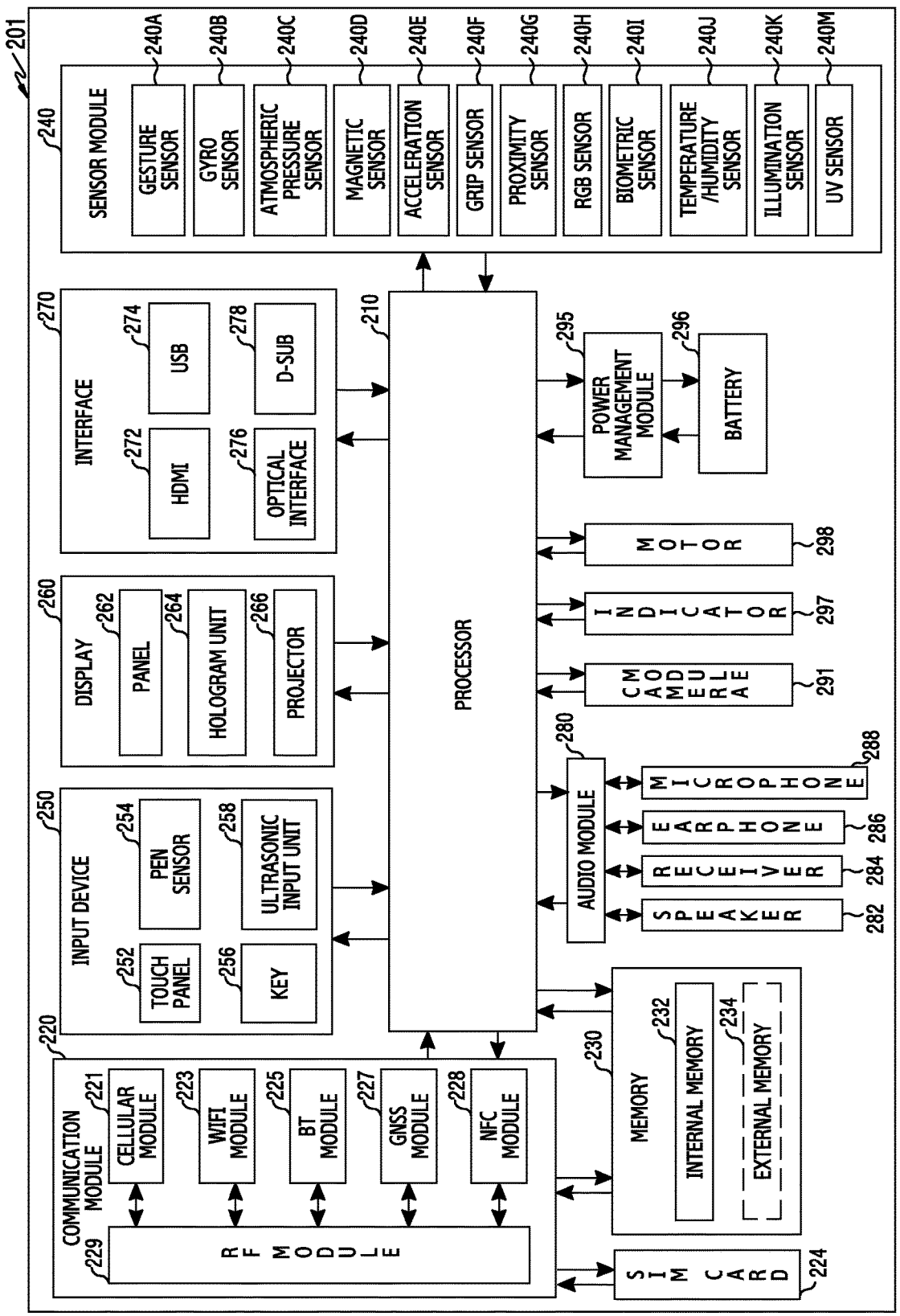
FIG. 2 is a block diagram of an electronic device according to an embodiment of the present disclosure.

FIG. 2 is a block diagram of an electronic device 201, according to an embodiment of the present disclosure.

Referring to FIG. 2, the electronic device 201 includes a processor (e.g., including processing circuitry) 210, a communication module (e.g., including communication circuitry) 220, a subscriber identification module (SIM) card 224, a memory 230, a sensor module 240, an input device (e.g., including input circuitry) 250, a display 260, an interface (e.g., including interface circuitry) 270, an audio module 280, a camera module 291, a power management module 295, a battery 296, an indicator 297, and a motor 298.

The processor 210 may include various processing circuitry and control a plurality of hardware or software elements connected to the processor 210 by driving an OS or an application program. The processor 210 may process a variety of data, including multimedia data, perform arithmetic operations, may be implemented with a system on chip (SoC), and may further include a GPU.

The communication module 220 may include various communication circuitry and perform data transmission/reception between an external electronic device and/or a server, which may be connected with the electronic device 201 through a network. The communication module 220 may include various communication circuitry, such as, for example, and without limitation, at least one of a cellular module 221, a WiFi module 223, a Bluetooth® (BT) module 225, a global navigation satellite system (GNSS) or GPS module 227, a near field communication (NFC) module 228, and a radio frequency (RF) module 229.

The cellular module 221 may provide a voice call, a video call, a text service, or an Internet service through a communication network, such as LTE, LTE-A, CDMA, WCDMA, UMTS, WiBro, or GSM. In addition, the cellular module 221 may identify and authenticate the electronic device 201 within the communication network by using the SIM card 224. The cellular module 221 may perform at least some of the functions that can be provided by the processor 210. For example, the cellular module 221 may perform multimedia control functions.

The cellular module 221 may include a CP. Further, the cellular module 221 may be implemented, for example, with an SoC.

Although elements, such as the cellular module 221, the memory 230, and the power management module 295 are illustrated as separate elements with respect to the processor 210 in FIG. 2, the processor 210 may also be implemented such that at least one part of the aforementioned elements, e.g., the cellular module 221, is included in the processor 210.

The processor 210 or the cellular module 221 may load an instruction or data, which is received from each non-volatile memory connected thereto or at least one of different elements, to a volatile memory and process the instruction or data. In addition, the processor 210 or the cellular module 221 may store data, which is received from at least one of different elements or generated by at least one of different elements, into a non-volatile memory.

Each of the WiFi module 223, the BT module 225, the GNSS module 227, and the NFC module 228 may include a processor for processing data transmitted/received through a corresponding module. Although the cellular module 221, the WiFi module 223, the BT module 225, the GNSS module 227, and the NFC module 228 are illustrated in FIG. 2 as separate blocks, at least two of the cellular module 221, the WiFi module 223, the BT module 225, the GNSS module 227, and the NFC module 228 may be included in one integrated circuit (IC) or IC package. For example, at least some of processors corresponding to the cellular module 221, the WiFi module 223, the BT module 225, the GNSS module 227, and the NFC module 228, such as a communication processor corresponding to the cellular module 221 and a WiFi processor corresponding to the WiFi module 223, may be implemented with an SoC.

The RF module 229 may transmit/receive data, such as an RF signal, and may include a transceiver, a power amplifier module (PAM), a frequency filter, or a low noise amplifier (LNA). In addition, the RF module 229 may further include a component for transmitting/receiving a radio wave in free space in wireless communication, e.g., a conductor or a conducting wire. The cellular module 221, the WiFi module 223, the BT module 225, the GNSS module 227, and the NFC module 228 may share the RF module 229, or at least one of these modules may transmit/receive an RF signal via a separate RF module.

The SIM card 224 may be inserted into a slot formed in the electronic device 201. The SIM card 224 includes unique identification information, such as an integrated circuit card identifier (ICCID) or subscriber information, such as an international mobile subscriber identity (IMSI).

The memory 230 includes an internal memory 232 and/or an external memory 234.

The internal memory 232 may include at least one of a volatile memory, such as a dynamic random access memory (DRAM), a static RAM (SRAM), or a synchronous dynamic RAM (SDRAM) or a non-volatile memory, such as a one-time programmable read only memory (OTPROM), a programmable ROM (PROM), an erasable and programmable ROM (EPROM), an electrically erasable and programmable ROM (EEPROM), a mask ROM, a flash ROM, a not and (NAND) flash memory, and a not or (NOR) flash memory. The internal memory 232 may be a solid state drive (SSD).

The external memory 234 may include a flash drive, a compact flash (CF), secure digital (SD) memory card, a micro-SD memory card, a mini-SD memory card, an extreme digital (xD) memory card, and a memory stick, and may be operatively coupled to the electronic device 201 via various interfaces.

The electronic device 201 may also include a storage unit (or a storage medium), such as a hard drive.

The sensor module 240 may measure a physical quantity or detect an operational state of the electronic device 201, and convert the measured or detected information into an electrical signal. The sensor module 240 includes a gesture sensor 240A, a gyro sensor 240B, an atmospheric pressure sensor 240C, a magnetic sensor 240D, an acceleration sensor 240E, a grip sensor 240F, a proximity sensor 240G, a color sensor 240H, e.g., a red, green, blue (RGB) sensor, a biometric sensor 240I, a temperature/humidity sensor 240J, an illumination sensor 240K, and an ultraviolet (UV) light sensor 240M.

Additionally or alternatively, the sensor module 240 may include other sensors, e.g., an electronic node (E-nose) sensor, an electromyography (EMG) sensor, an electroencephalogram (EEG) sensor, an electrocardiogram (ECG) sensor, and/or a fingerprint sensor.

The sensor module 240 may further include a control circuit for controlling at least one or more sensors included therein.

The input device 250 includes at least one of a touch panel 252, a (digital) pen sensor 254, a key 256, and an ultrasonic input unit 258. The touch panel 252 may recognize a touch input by using at least one of an electrostatic type configuration, a pressure-sensitive type configuration, and an ultrasonic type configuration. The touch panel 252 may further include a control circuit. When the touch panel is of the electrostatic type, both physical contact recognition and proximity recognition are possible. The touch panel 252 may further include a tactile layer, which provides the user with a tactile reaction.

The (digital) pen sensor 254 may include a recognition sheet which may be a part of the touch panel or may be separately implemented from the touch panel. The (digital) pen sensor 254 may be implemented using the same or similar method of receiving a touch input of a user or using an additional recognition sheet.

The key 256 may include a physical button, an optical key, or a keypad.

The ultrasonic input device 258 may detect ultrasonic waves generated by an input tool through a microphone 288, and may identify data corresponding to the detected ultrasonic waves.

The ultrasonic input unit 258 may detect a reflected sound wave through the microphone 288 and perform radio recognition. For example, an ultrasonic signal, which may be generated by using a pen, may be reflected off an object and detected by the microphone 288.

The electronic device 201 may use the communication module 220 to receive a user input from an external device, such as a computer or a server connected thereto.

The display 260 includes a panel 262, a hologram device 264, and a projector 266.

The panel 262 may be an LCD or an active matrix OLED (AM-OLED) and may be implemented in a flexible, transparent, or wearable manner. Alternatively, the panel 262 may be constructed as one module with the touch panel 252.

The hologram device 264 uses an interference of light and displays a stereoscopic image in the air.

The projector 266 displays an image by projecting a light beam onto a screen, which may be located inside or outside the electronic device 201.

The display 260 may further include a control circuit for controlling the panel 262, the hologram device 264, and/or the projector 266.

The interface 270 may include at least one of an HDMI 272, a USB 274, an optical communication interface 276, and a d-subminiature (D-sub) connector 278. The interface 270 may include a mobile high-definition link (MHL), an SD/multimedia card (MMC), and/or a standard of the Infrared Data Association (IrDA).

The audio module 280 bilaterally converts a sound and an electrical signal. The audio module 280 converts sound information, which is input or output through a speaker 282, a receiver 284, an earphone 286, and/or the microphone 288.

The speaker 282 may output a signal of an audible frequency band and a signal of an ultrasonic frequency band. Reflected waves of an ultrasonic signal emitted from the speaker 282 and a signal of an external audible frequency band may be received.

The camera module 291 captures an image and/or a video, and may include one or more image sensors, such as a front sensor or a rear sensor, a lens, an image signal processor (ISP), or a flash, such as an LED or a xenon lamp. Alternatively, the electronic device 201 may include two or more camera modules.

The power management module 295 manages power of the electronic device 201. The power management module 295 may include a power management integrated circuit (PMIC), a charger IC, and/or a battery gauge.

The PMIC may be included in an IC or an SoC semiconductor and may use a wired charging and/or a wireless charging method. The charger IC may charge the battery 296 and may prevent an over-voltage or over-current flow.

Different types of wireless charging may include a magnetic resonance type, a magnetic induction type, and an electromagnetic type. An additional circuit for the wireless charging, such as a coil loop, a resonant circuit, and/or a rectifier may be added.

The battery gauge may measure a residual quantity of the battery 296 and a voltage, current, and temperature during charging. The battery 296 stores or generates electricity and supplies power to the electronic device 201 by using the stored or generated electricity. The battery 296 may include a rechargeable battery or a solar battery.

The indicator 297 indicates a certain state, such as a booting state, a message, or a charging state of the electronic device 201 or a part thereof, such as the processor 210.

The motor 298 converts an electrical signal into a mechanical vibration.

Alternatively, the electronic device 201 includes a processing unit, such as a GPU, for supporting mobile TV, which processes media data according to a protocol, e.g., digital multimedia broadcasting (DMB), digital video broadcasting (DVB), and/or media flow.

Each of the aforementioned elements of the electronic device 201 may include one or more components, and the names thereof may vary depending on a type of the electronic device 201. Some of the elements illustrated in FIG. 2 may be omitted, and/or additional elements may be included therein. In addition, some of the elements of the electronic device 201 may be combined and constructed as a single entity, so as to equally perform functions of corresponding elements before combination.

At least some parts of the electronic device 201, such as modules or functions thereof, or operations, may be implemented with an instruction stored in a non-transitory computer-readable storage media. The instruction may be executed by the processor 210 to perform a function corresponding to the instruction. The non-transitory computer-readable storage media may be the memory 230. At least some parts of the programming module may be executed by the processor 210. At least some parts of the programming module may include modules, programs, routines, and a set of instructions for performing one or more functions.

Figure 3A:
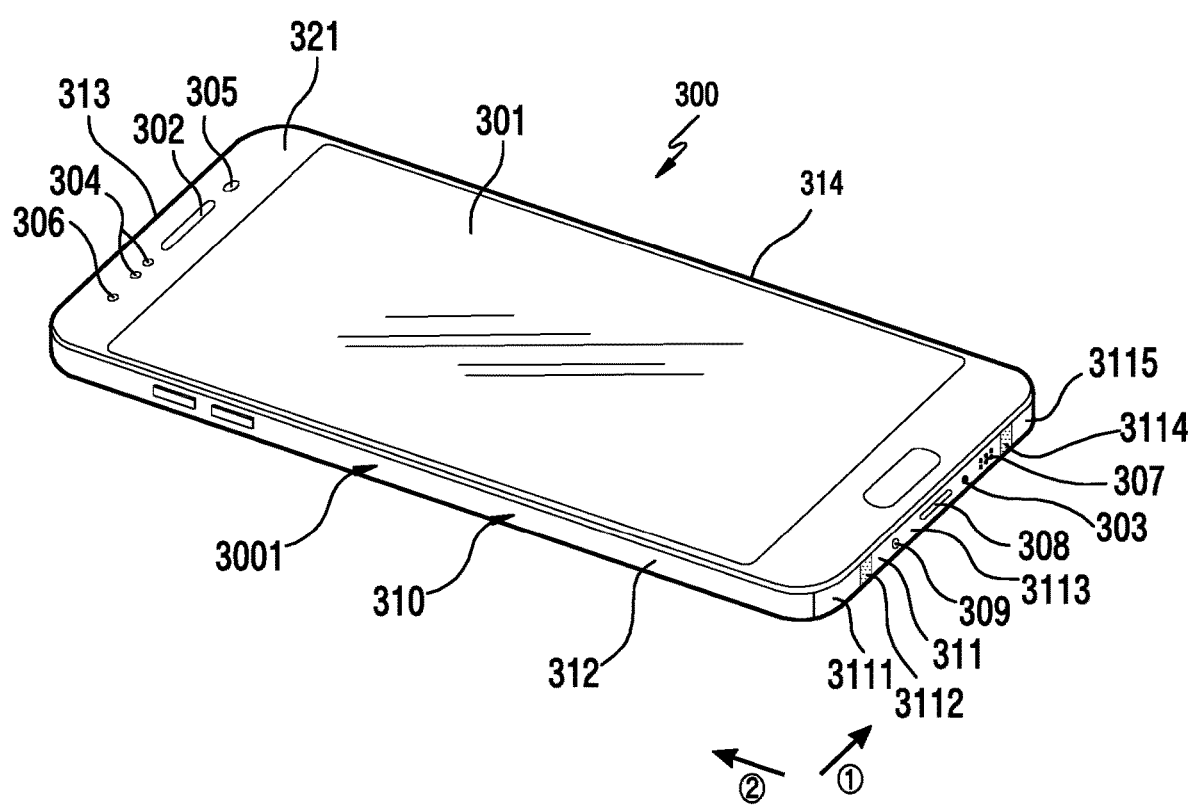
FIGS. 3A and 3B are perspective views of a front side and rear side of an electronic device according to an embodiment of the present disclosure.
Figure 3B:
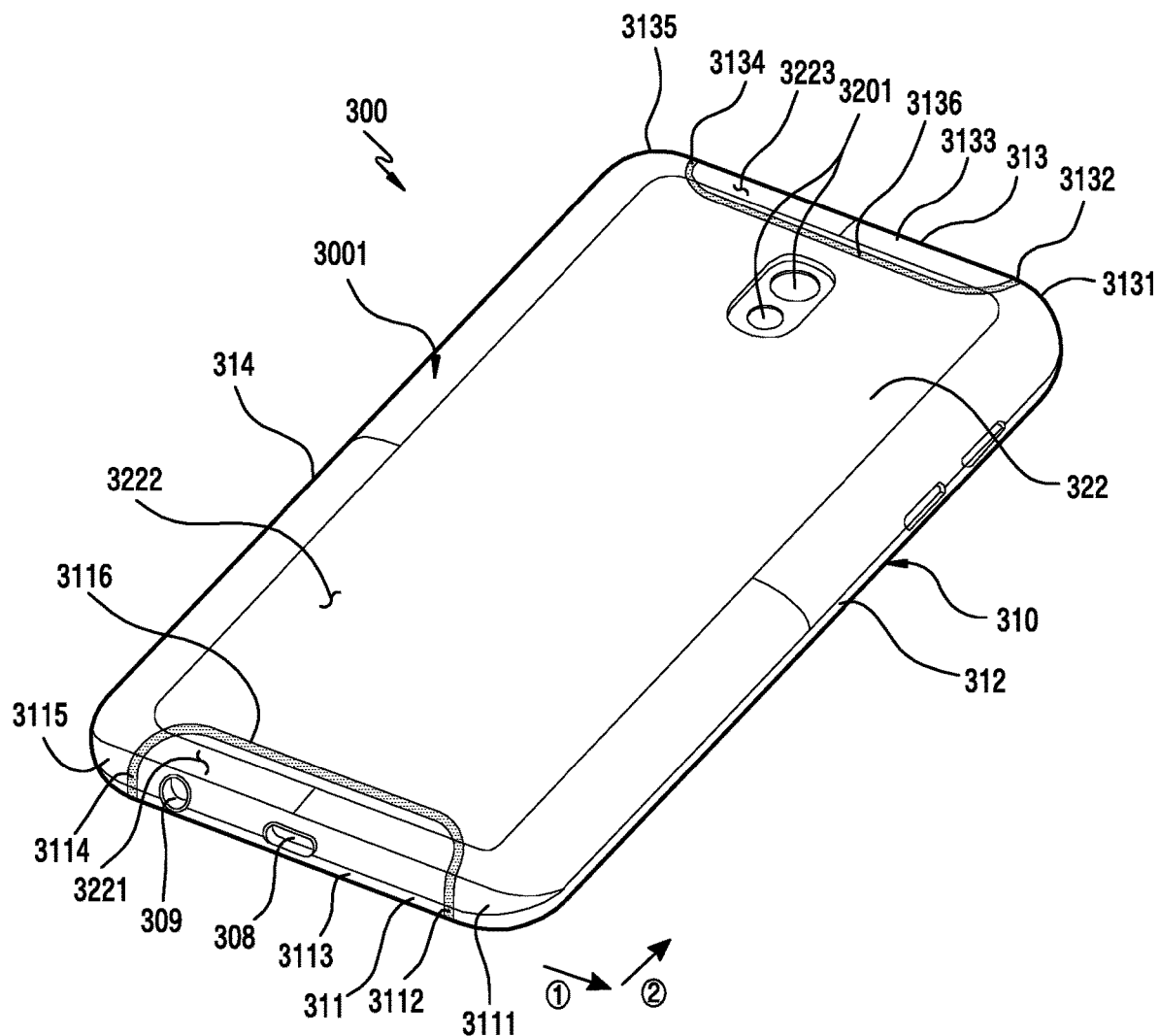

FIGS. 3A and 3B are perspective views illustrating a front side and rear side of an electronic device 300 according to an embodiment of the present disclosure.

Referring to FIGS. 3A and 3B, the electronic device 300 may include a housing 3001. According to one embodiment, the housing 3001 may be formed of a conductive member and/or a non-conductive member. The housing 3001 may include a first plate 321 (e.g., a front face or a first face), a second plate 322 (e.g., a rear face or a second face) that is disposed to be spaced apart from and to face the first plate 321, and a side member 310 that is disposed to surround a space between the first plate 321 and the second plate 322. The first plate 321, the second plate 322, and the side member 310 may be formed integrally.

According to an embodiment of the present disclosure, the electronic device 300 may include a display 301, which is disposed in a manner of being exposed in at least a partial region of the first plate 321. The display 301 may include a touch sensor so as to operate as a touch screen device. The display 301 may include a pressure sensor so as to operate as a pressure-responsive touch screen device. The electronic device 300 may include a receiver 302, which is disposed in the housing 3001 so as to output a voice of a communication partner. The electronic device 300 may include a microphone device 303, which is disposed in the housing 3001 so as to transmit a user's voice to a communication partner.

According to an embodiment of the present disclosure, the electronic device 300 may include components, which are disposed in a manner of being exposed in the display 301, or in a manner of performing functions through a window but not being exposed, in order to perform various functions of the electronic device 300. The components may include at least one sensor module 304. The sensor module 304 may include, for example, an illuminance sensor (e.g., an optical sensor), a proximity sensor (e.g., an optical sensor), an infrared sensor, an ultrasonic sensor, a fingerprint recognition sensor, or an iris recognition sensor. The components may include a front camera device 305. The components may include an indicator 306 (e.g., an LED device) that allows a user to recognize status information of the electronic device 300 with the naked eye.

According to an embodiment of the present disclosure, the electronic device 300 may include a speaker device 307, which is disposed on one side of the microphone device 303. The electronic device 300 may include an interface connector port 308, which is disposed on the other side of the microphone device 303 in order to receive a data transmission/reception function by an external device and external power to charge the electronic device 300. The electronic device 300 may include an ear jack assembly 309, which is disposed on one side of the interface connector port 308.

According to an embodiment of the present disclosure, the display 301 may be disposed in such a manner that substantially the entire region of a first plate 321 of the electronic device 300 and a partial region of the side member 310 or a partial region of a second plate 322 including the side member 310 are defined as a display region. In this case, the above-described electronic components (e.g., at least one of a speaker device, a microphone device, various sensor modules, and a camera device) may be disposed so to perform the functions thereof within the electronic device 300 through the display 301 (or a window) or to be exposed to a region of the housing 310 other than the display region.

According to an embodiment of the present disclosure, the electronic device 300 may include a component 3201 that is disposed to be exposed to at least a partial region of the first plate 321. The components 3201 may include a rear camera device, an illuminance sensor (e.g., an optical sensor), a proximity sensor (e.g., an optical sensor), an infrared sensor, an ultrasonic sensor, a heart rate sensor, a flash device, or a fingerprint recognition sensor.

According to an embodiment of the present disclosure, the side member 310 may include a first side face 311 extending in a first direction (direction ①) and having a first length; a second side face 312 extending in a second direction (direction ②) perpendicular to the first direction and having a second length longer than the first length; a third side face 313 extending parallel to the first side face 311 and having the first length; and a fourth side face 314 extending parallel to the second side face 312 and having the second length. The first side face 311 may include a first conductive portion 3111, a first non-conductive portion 3112, a second conductive portion 3113, a second non-conductive portion 3114, and a third conductive portion 3115, which are sequentially disposed between the second side face 312 and the fourth side face 314. The third side face 313 may include a fourth conductive portion 3131, a third non-conductive portion 3132, a fifth conductive portion 3133, a fourth non-conductive portion 3134, and a sixth conductive portion 3135, which are sequentially disposed between the second side face 312 and the fourth side face 314.

According to an embodiment of the present disclosure, the second plate 322 may be formed of a conductive material. The second plate 322 may include a first non-conductive slit 3116, which surrounds a first conductive region 3221 together with the second conductive portion 3113 when viewed from the upper side of the second plate 322 and extends from the first non-conductive portion 3112 to the second non-conductive portion 3114. The second plate 322 may include a second non-conductive slit 3136, which surrounds a third conductive region 3223 together with the fifth conductive portion 3133 when viewed from the upper side of the second plate 322 and extends from the third non-conductive portion 3132 to the fourth non-conductive portion 3134. The distance between the first non-conductive slit 3116 and the first side face 311 and the distance between the second non-conductive slit 3136 and the third side face 313 may be defined according to the radiation characteristic of the antenna. The distance between the first non-conductive slit 3116 and the first side face 311 and the distance between the second non-conductive slit 3136 and the third side face 313 may, or may not be, equal to each other.

According to an embodiment of the present disclosure, the electronic device 300 may include therein a PCB (e.g., the board 530 of FIG. 5B) including a board slit (e.g., a board slit 534 illustrated in FIG. 5B) at a location where the board slit at least partially overlaps each of the first non-conductive slit 3116 and the second non-conductive slit 3136. The electronic device 300 may include a slit antenna in which the peripheral regions of the first non-conductive slit 3116 and the second non-conductive slit 3136 of the second plate 322 operate in conjunction with the board slit (e.g., the board slit 534 of FIG. 5B) in the board (e.g., the board 530 of FIG. 5B). The first non-conductive slit 3116 and the second non-conductive slit 3136 operate not only in a first operating frequency band by the electric length of the slits 3116 and 3136, each of which bypasses at least a portion of the second conductive region 3222 of the second plate 322 and extends to the first side face 311 or the third side face 313, but also in at least one second frequency band by the electric length of the first conductive region 3221 and the third conductive region 3223. Thus, the first non-conductive slit 3116 and the second non-conductive slit 3136 may be advantageous for implementing a multi-band antenna, and it is possible to prevent the radiation performance from being degraded due to a hand effect caused by gripping side faces.

Figure 4:
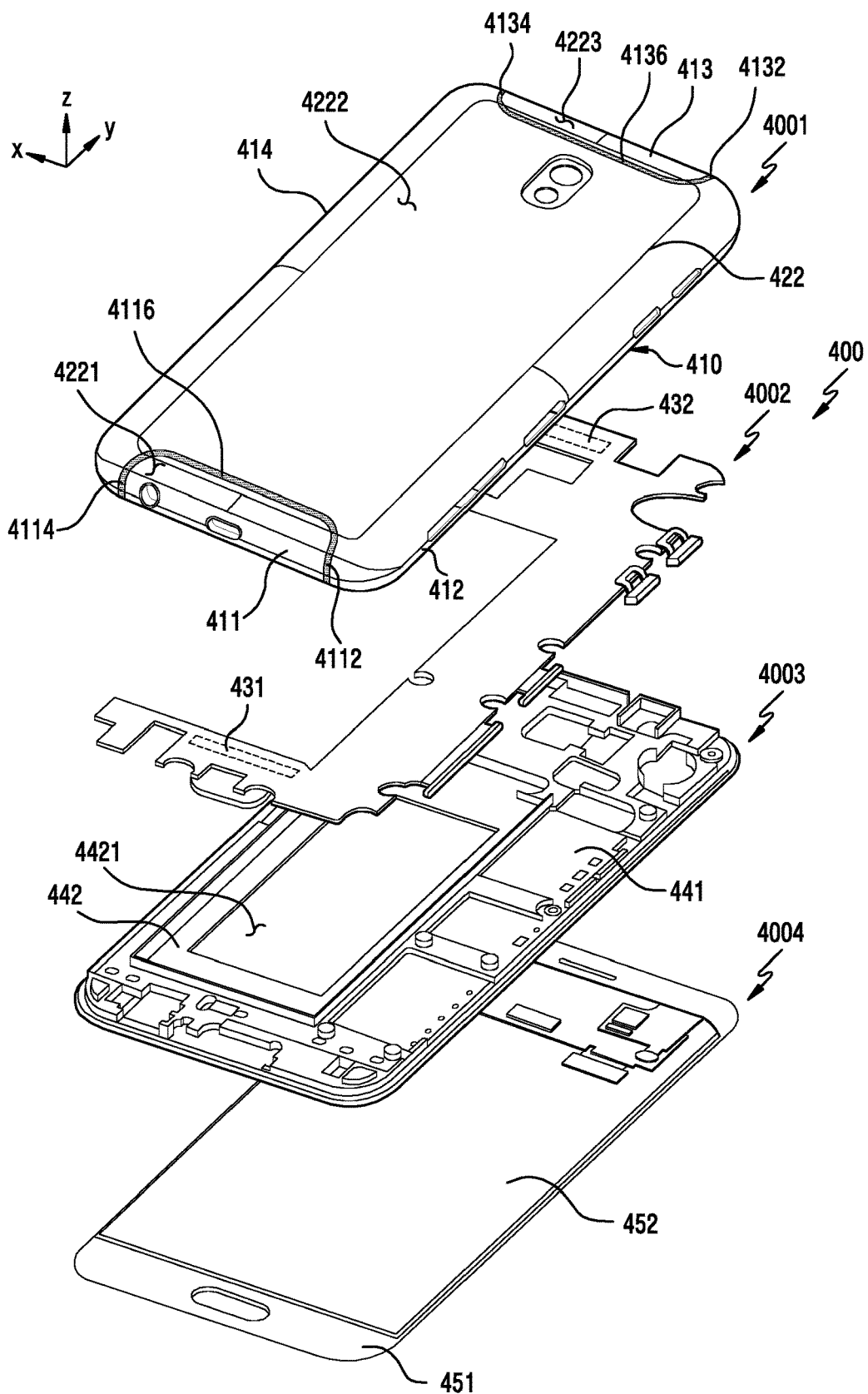
FIG. 4 is an exploded perspective view of an electronic device according to an embodiment of the present disclosure.

FIG. 4 is an exploded perspective view of an electronic device 400 according to an embodiment of the present disclosure.

The electronic device 400 may include an embodiment which is similar to, or different from, the electronic device 300 of FIGS. 3A and 3B.

Referring to FIG. 4, the electronic device 400 may include a housing 4001 generally formed of a metallic material, a board 4002 disposed in the inner space of the housing 4001, a support member 4003, and a display 4004 coupled to the housing 4001 so as to contribute to a part of the appearance of the electronic device 400. The electronic device 400 may include a battery for power supply, which is disposed inside the electronic device 400 and a wireless charging member for charging the battery.

According to an embodiment of the present disclosure, the housing 4001 may include a second plate 422 disposed at a position opposite to the first plate, and a side member 410 disposed in the manner of surrounding a space between the first plate and the second plate 422. The first plate, the second plate 422, and the side member 410 may be formed integrally. According to an embodiment of the present disclosure, the second plate 422 may be formed of a conductive material. The second plate 422 may include a first conductive region 4221, a second conductive region 4222 and a third conductive region 4223 formed by a first non-conductive slit 4116 and a second non-conductive slit 4136 respectively.

According to an embodiment of the present disclosure, the side member 410 may include a first side face 411, a second side face 412, a third side face 413, and a fourth side face 414. The second plate 422 may include the first non-conductive slit 4116 and the second non-conductive slit 4136, which are disposed around the first side face 411 and the third side face 413, respectively. The opposite ends of the first non-conductive slit 4116 may respectively extend to a first non-conductive portion 4112 and a second non-conductive portion 4114, which are disposed in the first side face 411. The opposite ends of the second non-conductive slit 4136 may respectively extend to a third non-conductive portion 4132 and a fourth non-conductive portion 4134, which are disposed in the third side face 413. The vertical distances from the non-conductive slits 4116 and 4136 to the respective side faces 411 and 413 may be the same as or different from each other. The non-conductive slits 4116 and 4136 may include a non-conductive material (e.g., a synthetic resin, a resin, rubber, or the like), which are disposed in the second plate 422 made of a metal by a double injection molding process or an insert molding process.

According to an embodiment of the present disclosure, the board 4002 may include a a PCB disposed within the space defined by the first plate, the second plate 422, and the side member 410. The board 4002 may include one or more board slits 431 and 432. The board slits 431 and 432 may include a fill-cut region in which a conductive ground region of the board 4002 is omitted. However, the present disclosure is not limited thereto, and the board slits 431 and 432 may be formed in a shape in which the board made of a dielectric material is omitted. When assembled to the housing 4001, the board slits 431 and 432 may be disposed such that at least a partial region of each of the board slits 431 and 432 overlaps the non-conductive slit 4116 or 4136 in the vertical direction (e.g., the Z-axis direction). The peripheral region of each non-conductive slits 4116 or 4136 of the housing 4001 may operate as a slit antenna by overlapping the board slit 431 or 432.

According to an embodiment of the present disclosure, the display 4004 may be disposed in such a manner that it is exposed in at least a partial region of the first plate of the housing 4001. The display 4004 may include a window 451 and a display module 452 attached to the rear face of the window 451. The display 4004 may operate as a touch screen device including a touch sensor. The display 4004 may operate as a pressure-responsive touch screen device including a touch sensor and a pressure sensor.

According to an embodiment of the present disclosure, the support member 4003 (e.g., an intermediate plate) may be disposed between the housing 4001 and the display 4004. The support member 4003 may support, for example, the board 4002 and a battery and may enhance the rigidity of the electronic device 400. The support member 4003 may include a battery mounting portion 442 and a board mounting portion 441 disposed in at least a partial region along the periphery of the battery mounting portion 442. According to one embodiment, the board 4002 and the battery (not illustrated) are arranged parallel to each other without overlapping each other on the support member 4003, or may be arranged in such a manner that the board 4002 and the battery least partially overlap each other in the vertical direction (e.g., the Z-axis direction0. According to one embodiment, the intermediate plate (e.g., the support member) 4003 may include an opening 4421 having a predetermined size formed in the battery mounting portion 442 in order to cope with the swelling phenomenon of the battery.

Figure 5A:
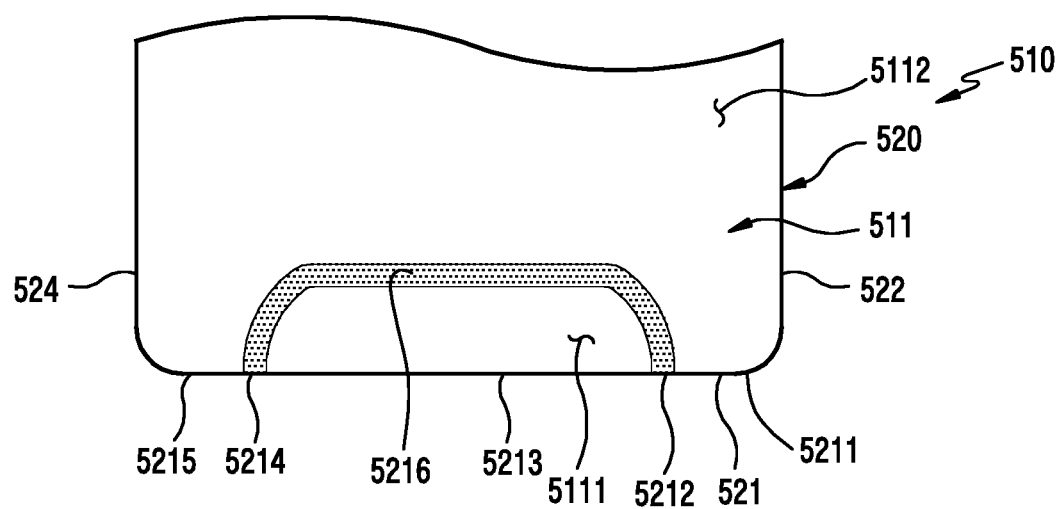
FIG. 5A is a view of a housing according to an embodiment of the present disclosure.

FIG. 5A is a view illustrating a housing 510 according to an embodiment of the present disclosure.

Figure 5B:
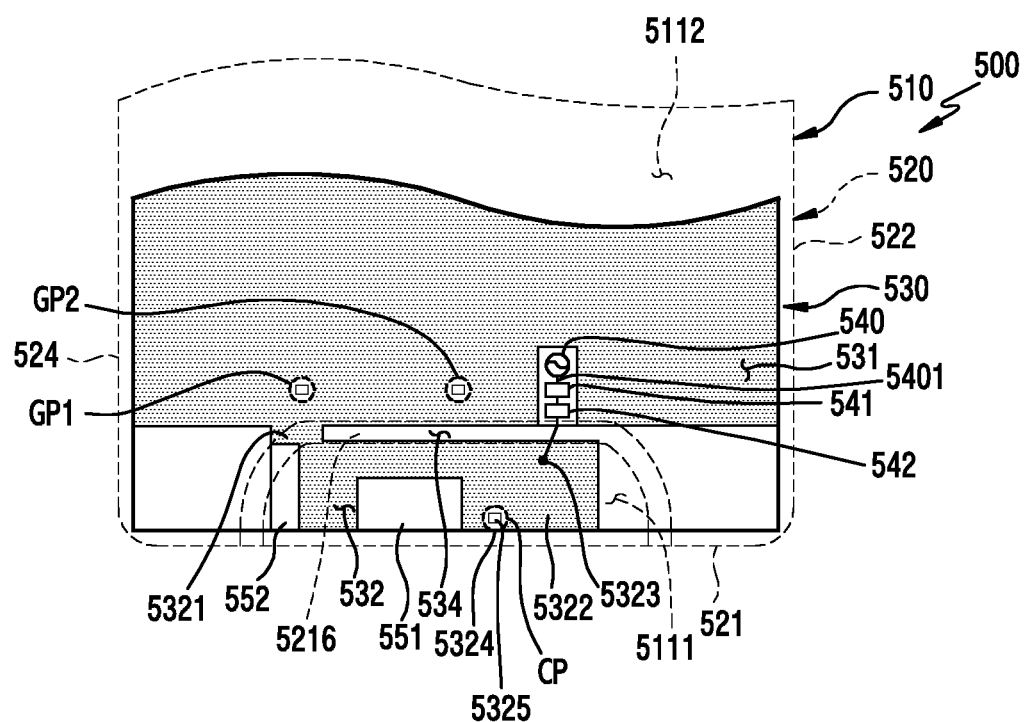
FIG. 5B is a view of an electronic device, in which a state in which the housing of FIG. 5A is coupled to a PCB according to an embodiment of the present disclosure.

FIG. 5B is a view of an electronic device 500, in which a state in which the housing 510 of FIG. 5A is coupled to a board according to an embodiment of the present disclosure.

The housing 510 of FIG. 5A may be similar to the housing 310 of FIGS. 3A and 3B or the housing 410 of FIG. 4, or may include another embodiment of the housing. The board 530 in FIG. 5B may be similar to the board 4002 of FIG. 4, or may include another embodiment of the board.

Referring to FIG. 5A, a first non-conductive slit 5216 is disposed around a first side face 521 of a second plate 511 of the housing 510, but the present disclosure is not limited thereto. For example, the first non-conductive slit 5216 may be disposed around a third side face, which is opposite to the first side face 521 of the housing 510, or may be disposed around both of the first side face 521 and the third side face.

The housing 510 may include the second plate 511 which at least partially includes a metallic material and a side member 520 which is disposed along the peripheral edge of the second plate 511 to have a predetermined height. According to one embodiment, the second plate 511 may be formed integrally with the side member 520. The side member 520 (e.g., the side member 310 of FIG. 5B) may include the first side face 521, a second side face 522, a third side face, and a fourth side face 524. The first side face 521 may include a first conductive portion 5211, a first non-conductive portion 5212, second conductive portion 5213, a second non-conductive portion 5214, and a third conductive portion 5215, which are sequentially disposed between the second side face 522 and the fourth side face 524. The second plate 511 may include the first non-conductive slit 5216, which surrounds a first conductive region 5111 together with the second conductive portion 5213 when viewed from the upper side of the second plate 511 and extends from the first non-conductive portion 5212 to the second non-conductive portion 5214. The second plate 511 is divided, by a first non-conductive slit 5216, into a first conductive region 5111 that operates as an antenna radiator and a second conductive region 5112 that operates as a ground. The distance between the first non-conductive slit 5216 and the first side face 521 may be defined according to the radiation characteristic of a desired antenna.

Referring to FIG. 5B, according to one embodiment, the board 530 may include a main ground plane 531 and a ground extension 532 disposed between the first conductive region 5111 of the second plate (e.g., the second plate 511 of FIG. 5A) and the first side face 521. The ground extension 532 may extend from the main ground plane 531 in an L shape. The ground extension 532 may include a first portion 5321 extending from the main ground plane 531 toward the first side face 521 and a second portion 5322 extending from the first portion 5321 toward the second side face 522. The board 530 may include a board slit 534 having a predetermined length and a predetermined width, which is formed by the main ground plane 531 and the second portion 5322.

According to an embodiment of the present disclosure, the second portion 5322 may be electrically connected to a first point 5323 via a power feeding portion 540 (e.g., a communication circuit) disposed on the board 530. The second portion 5322 may be electrically connected to the first point 5323 through the power feeding portion 540 and across the board slit 534 using a separate electrical path 5401. The electrical path 5401 may include a pattern formed on the board 530, a fine wire cable, or a flexible PCB (FPCB). The board 530 may include at least one element disposed in the electrical path 5401 between the power feeding portion 540 and the first point 5323. At least one element may further include an electrostatic discharge (ESD) and electric shock prevention circuit 542 which is disposed in the electrical path 5401 so as to prevent electric shock and to discharge static electricity, and a matching circuit 541 configured to tune the slit antenna to a desired frequency band.

According to an embodiment of the present disclosure, an electrical connector 5325 may be disposed at a second point 5324 spaced apart from the first point 5323 in the second portion 5322. The electrical connector 5325 may include a C-clip, conductive tape, or a conductive pad. When the housing 510 is coupled to the board 530, the electrical connector 5325 may come into physical contact with a corresponding location in the first conductive region 5111 of the housing 510 via a contact point CP.

According to an embodiment of the present disclosure, the first non-conductive slit 5216 and the first conductive region 5111 of the housing 510 are coupled with the board 530 to operate as a slit antenna in conjunction with the board slit 534 in the board. When the housing 510 is coupled to the board 530, at least a partial region of the first non-conductive slit 5216 of the housing 510 may be disposed to overlaps the board slit 534 in the board 530. The electrical connector 5325 disposed in the second portion 5322 of the ground extension 532 may be electrically connected to the corresponding location in the first conductive region 5111 of the housing 510. The main ground plane 531 of the board 530 may be electrically connected to the second conductive region 5112 of the housing 510 at one or more ground points GP1 and GP2, thereby expanding and strengthening the ground.

According to an embodiment of the present disclosure, one or more electronic components 551 and 552 may be mounted on the ground extension 532 of the board 530. When the electronic components 551 and 552 are conductive components, the components may operate as a part of an antenna radiator (e.g., a metal device antenna (MDA)) by tuning the electronic components 551 and 552 as a part of the antenna radiator. The electronic components 551 and 552 may include at least one of an interface connector port, an ear-jack assembly, a speaker device, a microphone device, a camera device, and various sensor modules.

According to an embodiment of the present disclosure, the first non-conductive slit 5216 may be configured to have a first conductive region 5111 having a predetermined length and width by being connected to the first non-conductive portion 5212 and the second non-conductive portion 5214 of the first side face at the opposite ends thereof in a partial region of the second plate 511, rather than extending from the second plate 511 to the second side face 522 and the fourth face 524. The antenna may be implemented as a multi-band antenna, which operates in a first operating frequency band by the first non-conductive slit 5216 of the housing 510, which has a predetermined length, and the board slit 534 in the board 530, and operates in a second operating frequency band when the first conductive region 5111 of the housing 530 is fed with power.

According to an embodiment of the present disclosure, a flexible conductive member may be applied to the contact point CP or the ground point GP for electrical connection, disposed between the board 530 and the housing 510. According to one embodiment, the flexible conductive member may include a C-clip, a conductive tape, or a conductive pad.

Figure 6A:
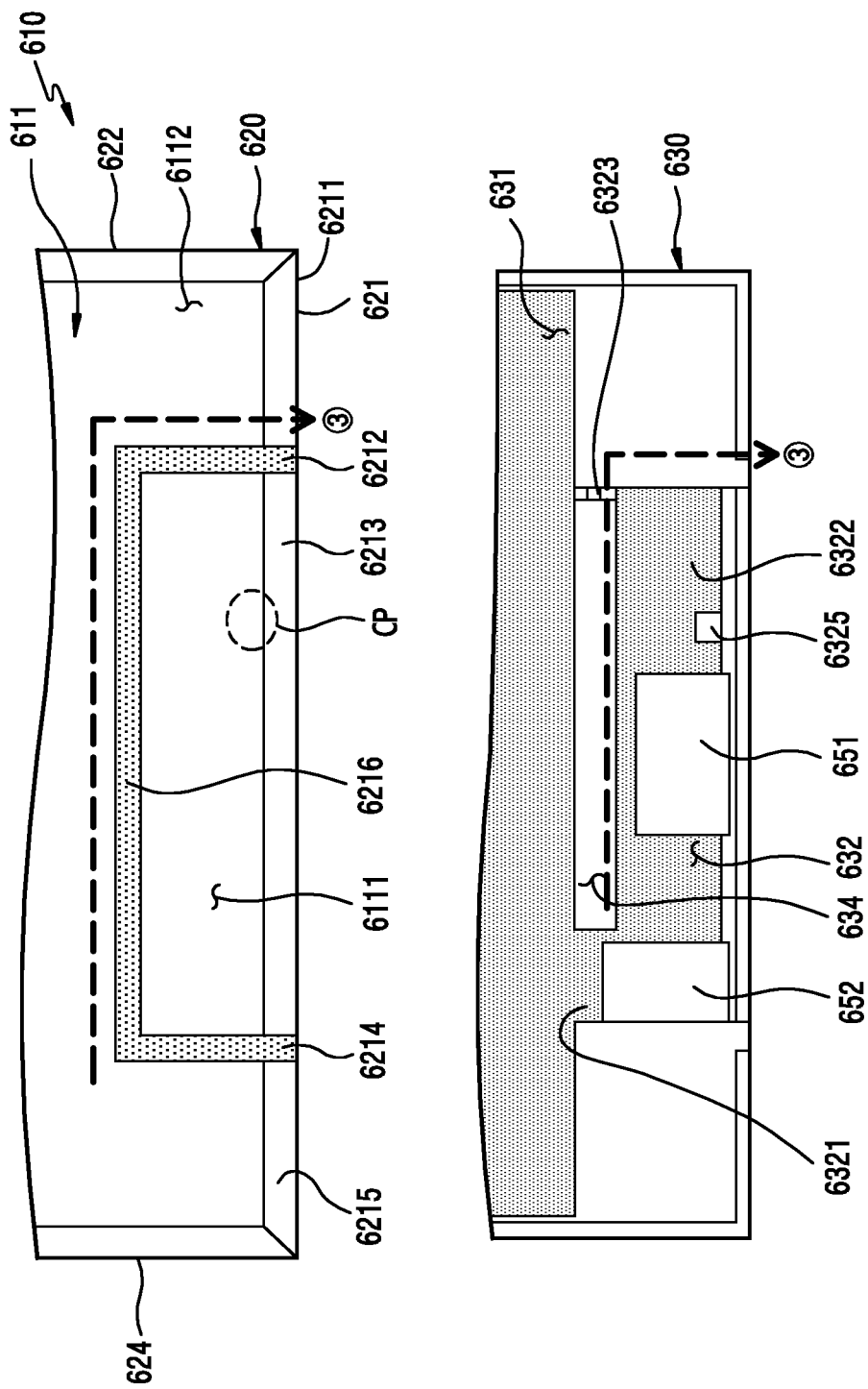
FIGS. 6A and 6B are views of an antenna according to an embodiment of the present disclosure
Figure 6B:
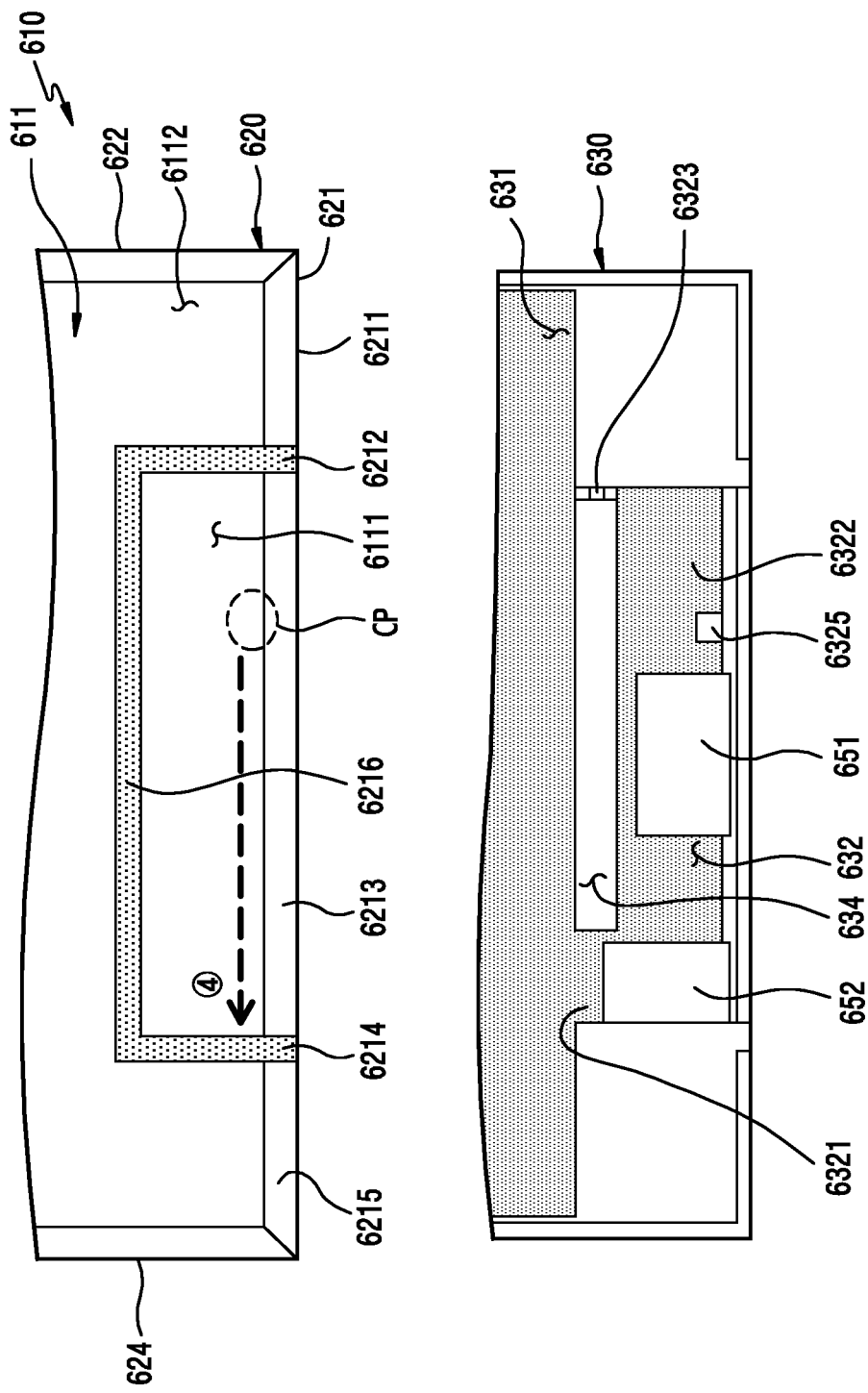

FIGS. 6A and 6B are views each illustrating a configuration of an antenna according to an embodiment of the present disclosure.

Referring to FIGS. 6A and 6B, a housing 610 and a board 630 may be similar to the housing 510 and the board 530 of FIGS. 5A and 5B, or may include another embodiment of the housing and the board.

The housing 610 may include a second plate 611 at least partially including a metallic material and a side member 620 disposed along the peripheral edge of the second plate 611 to have a predetermined height. According to one embodiment, the second plate 611 may be formed integrally with the side member 620. The side member 620 (e.g., the side member 310 of FIG. 3B) may include a first side face 621, a second side face 622, a third side face, and a fourth side face 624. The first side face 621 may include a first conductive portion 6211, a first non-conductive portion 6212, a second conductive portion 6213, a second non-conductive portion 6214, and a third conductive portion 6215, which are sequentially disposed between the second side face 622 and the fourth side face 624. The second plate 611 may include a first non-conductive slit 6216, which surrounds a first conductive region 6111 together with the second conductive portion 6213 when viewed from the upper side of the second plate 611 and extends from the first non-conductive portion 6212 to the second non-conductive portion 6214. The second plate 611 is divided, by a first non-conductive slit 6216, into a first conductive region 6111 that operates as an antenna radiator and a second conductive region 6112 that operates as a ground.

According to an embodiment of the present disclosure, the board 630 coupled to the above-mentioned housing 610 may include a main ground plane 631 and a ground extension 632 disposed between the first conductive region 6111 of the second plate 611 and the first side face 621. The ground extension 632 may extend from the main ground plane 631 in an L shape. The ground extension 632 may include a first portion 6321 extending from the main ground plane 631 toward the first side face 621 and a second portion 6322 extending from the first portion 6321 toward the second side face 622. The board 630 may include a board slit 634 having a predetermined length and a predetermined width, which are formed by the main ground plane 631 and the second portion 6322. One or more conductive electronic components 651 and 652 may be mounted on the second portion 6322, and the conductive electronic components 651 and 652 may also operate as a part of an antenna radiator.

According to an embodiment of the present disclosure, the board 630 may include a power feeding portion 6323 electrically connected to the second portion 6322 via a communication circuit. The board 630 may come into physical contact with the contact point CP of the housing 610, thereby being electrically connected to the contact point CP, in which the contact point CP is mounted by mounting an electrical connector 6325 in another region of the second portion 6322, which is spaced apart from the power feeding portion 6323.

According to an embodiment of the present disclosure, the antenna includes a radiation current path (path ③ in FIG. 6A) having an electrical length corresponding generally to the board slit 634 in the power feeding portion 6323, so that the antenna may serve as a slit antenna operating in the first operating frequency band. Further, the antenna includes a radiation current path (the path ④ in FIG. 6B) having an electrical length from the contact point CP of the housing 610, which is in physical contact with the electrical connector 6325 of the board 630, to the second non-conductive portion 6214 of the housing 610, so that the antenna may serve as an antenna operating in a second operating frequency band. However, without being limited thereto, the antenna may operate in an operating frequency band having a bandwidth changed or expanded through electromagnetic coupling with a fifth conductive portion 66215 of the housing 610. The first operating frequency band may include a low band. The second operating frequency band may include a mid band or a high band.

Figure 6C:
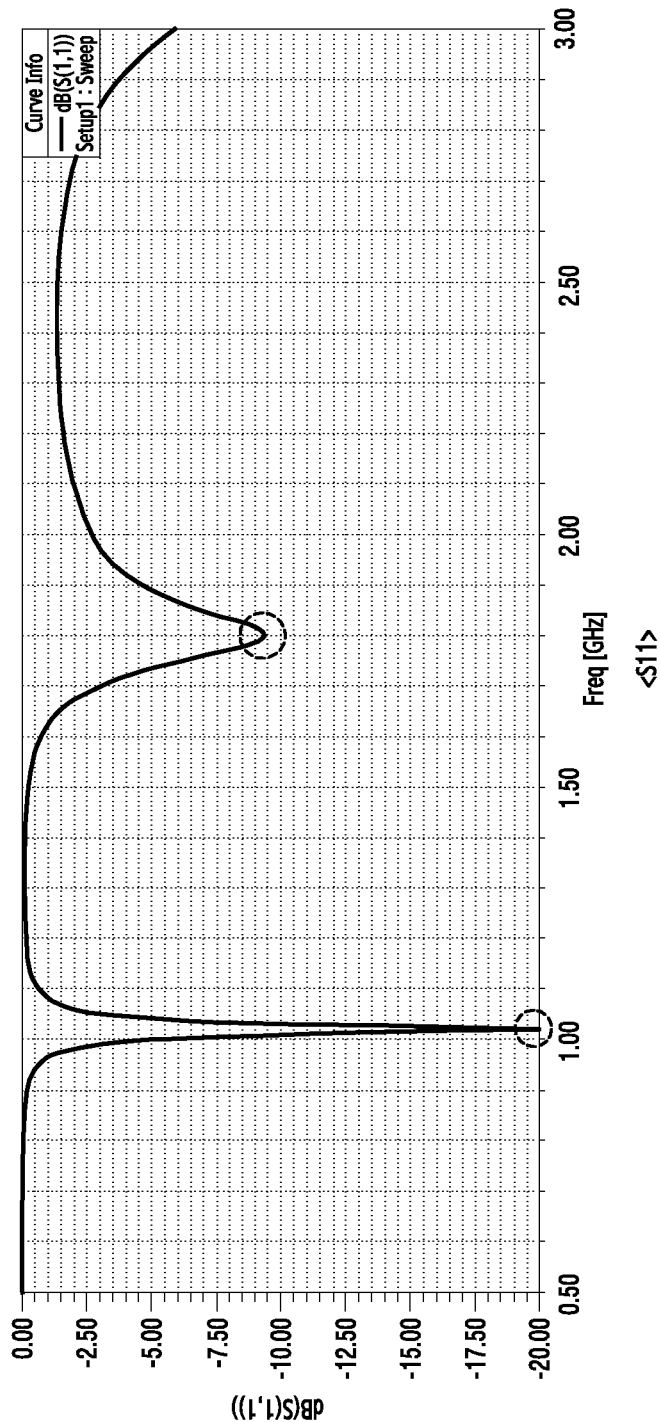
FIG. 6C is an S11 graph of an antenna that operates by the configuration of FIGS. 6A and 6B according to an embodiment of the present disclosure.

FIG. 6C is a S11 graph of an antenna operating with the configuration of FIGS. 6A and 6B according to an embodiment of the present disclosure.

Referring to FIG. 6C, it can be seen that by forming the shape of the first non-conductive slit 6216 in the housing 610, the antenna of the electronic device operates in at least two operating frequency bands. For example, it can be seen that the antenna operates in a frequency band of about 1 GHz in the region having the radiation current path of FIG. 6A and operates in a frequency band of about 1.8 GHz, which is a relatively high frequency band, in the region having the radiation current path of FIG. 6B.

Figure 7:
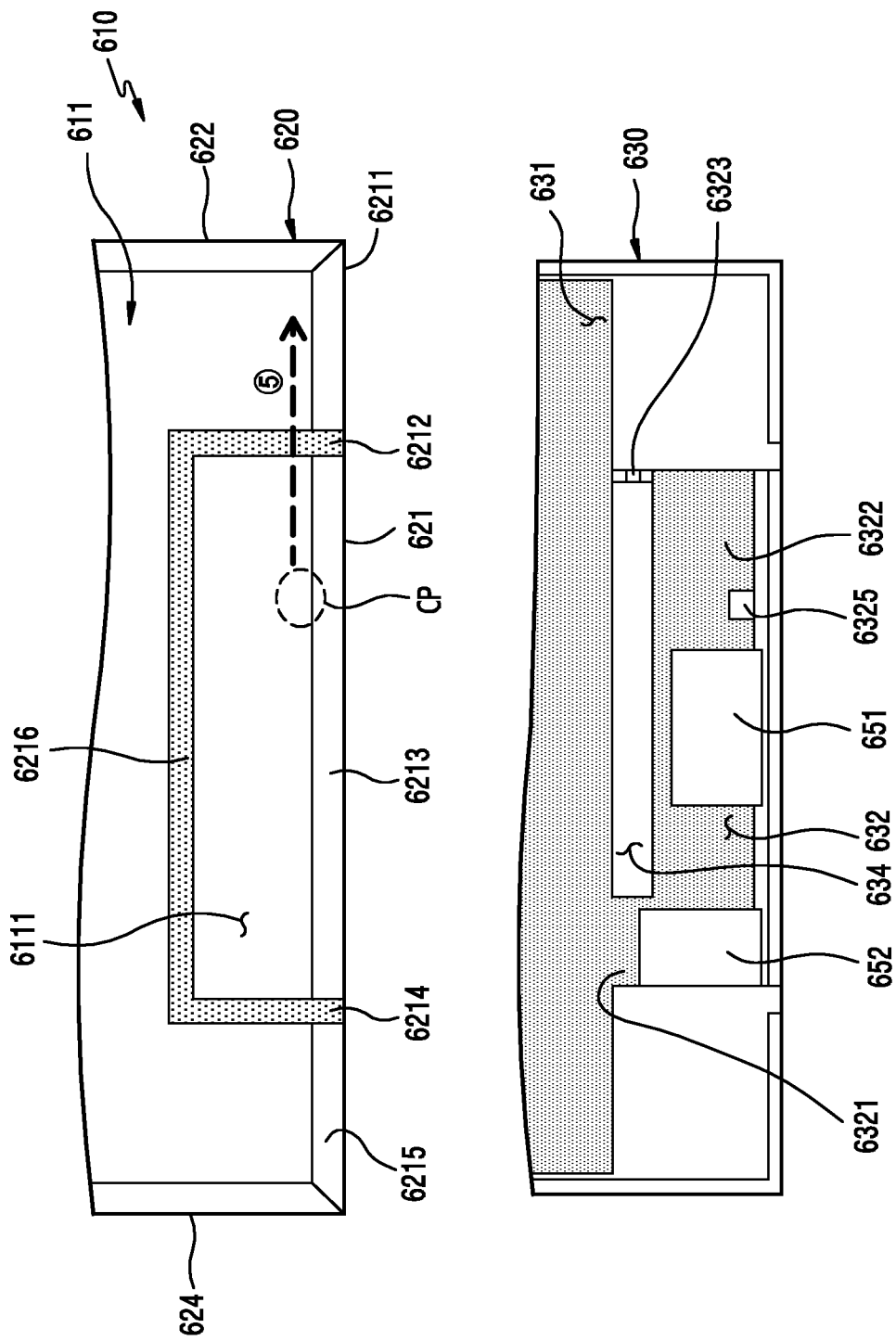
FIG. 7 is a view of an antenna having the configuration of FIGS. 6A and 6B which operates in different frequency bands according to an embodiment of the present disclosure.

FIG. 7 is a view illustrating a state in which an antenna having the configuration of FIGS. 6A and 6B operates in different frequency bands according to an embodiment of the present disclosure.

Referring to FIG. 7, the antenna according to the present disclosure may have a radiation current path operating in a third operating frequency band in addition to the radiation current paths of FIGS. 6A and 6B described above. For example, the antenna includes a radiation current path (the path ⑤ in FIG. 6C) having an electrical length from the contact point CP of the housing 610, which is in physical contact with the electrical connector 6325 of the board 630, to the first non-conductive portion 6212 of the housing 610, so that the antenna may serve as an antenna operating in a third operating frequency band. According to one embodiment, the third operating frequency band may include a high band or a mid band. However, without being limited thereto, the antenna may operate in an operating frequency band having a bandwidth changed or expanded through electromagnetic coupling with the first conductive portion 6211 of the housing.

Figure 8A:
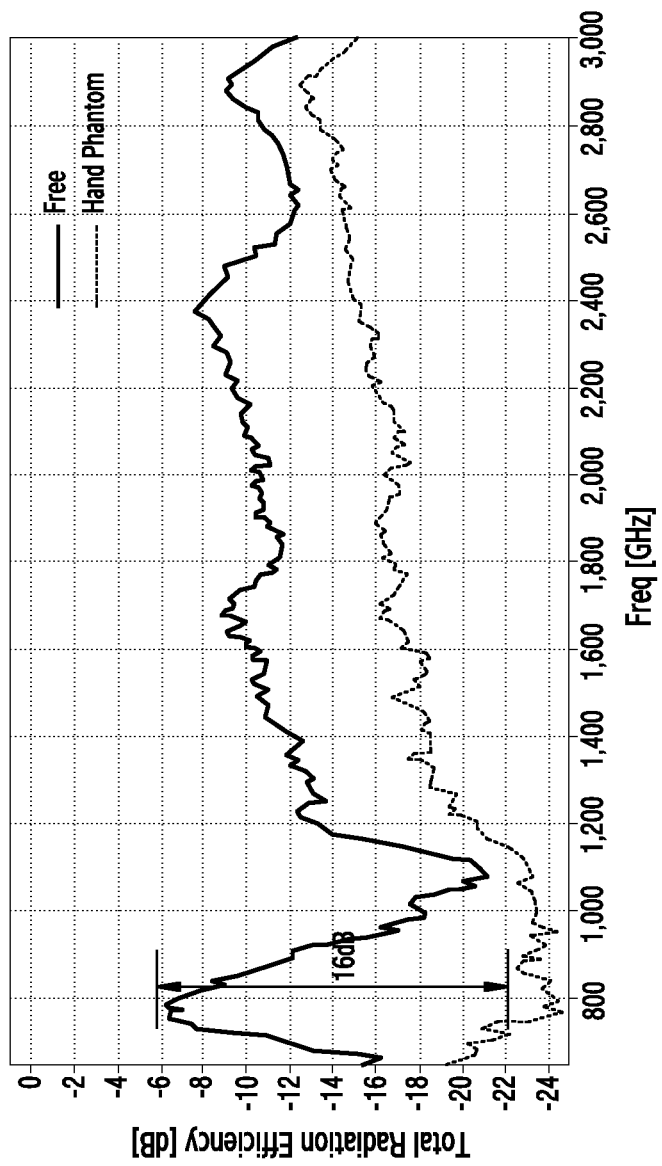
FIGS. 8A and 8B are graphs comparing hand phantom efficiencies of an antenna according to an embodiment of the present disclosure and an existing antenna.
Figure 8B:
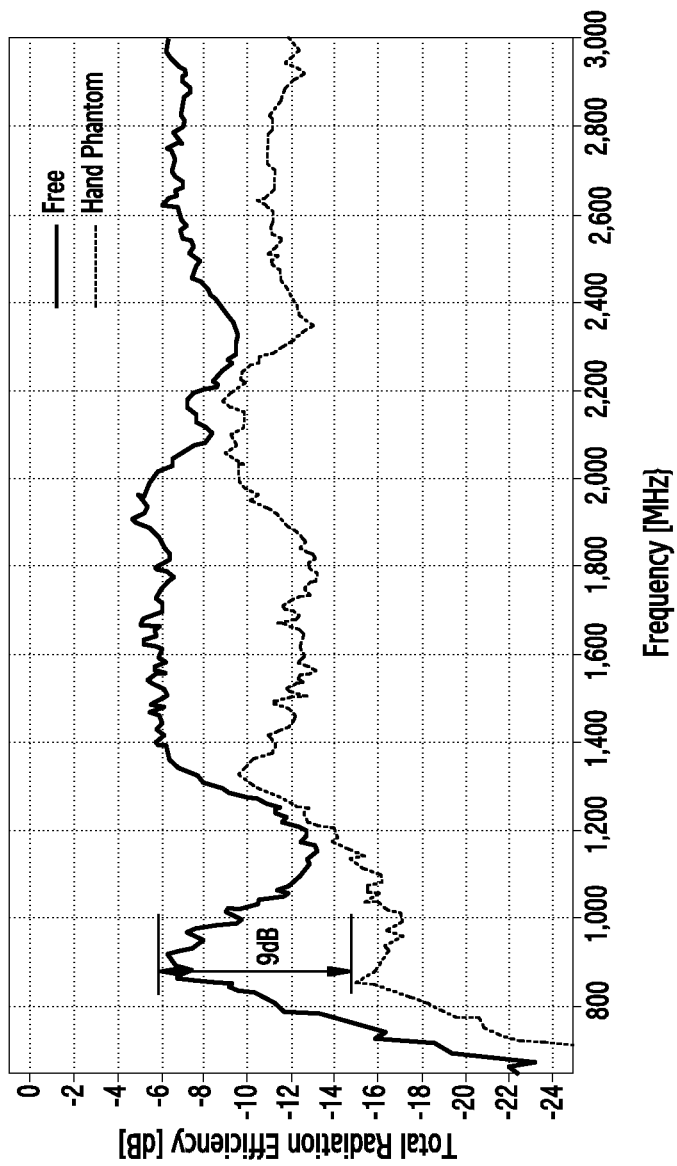

FIGS. 8A and 8B are graphs comparing hand phantom efficiencies of an antenna according to an embodiment of the present disclosure and an existing antenna.

Referring to FIGS. 8A and 8B, FIG. 8A is a graph illustrating a loss of an antenna according to a hand effect in the state in which the first non-conductive slit 6216 of FIG. 6A extends to the second side face 622 and the fourth side face 624 as in the prior art, and FIG. 8B is a graph illustrating a loss of an antenna when the first non-conductive slit 6216 extends to the first side face 621 of the second plate 611, rather than extending to the second side face 622 and the fourth side face 624 as illustrated in FIG. 6A.

According to an embodiment of the present disclosure, it can be seen that while the loss bandwidth due to the hand effect of the antenna, which is caused by the conventional non-conductive slit, is 16 dB, when the non-conductive slit 6216 is applied to the housing 610 according to the present disclosure under the same conditions, the loss bandwidth due to the hand effect of the antenna is 8 dB, so that a considerable improvement can be obtained in terms of the loss bandwidth.

Figure 9A:
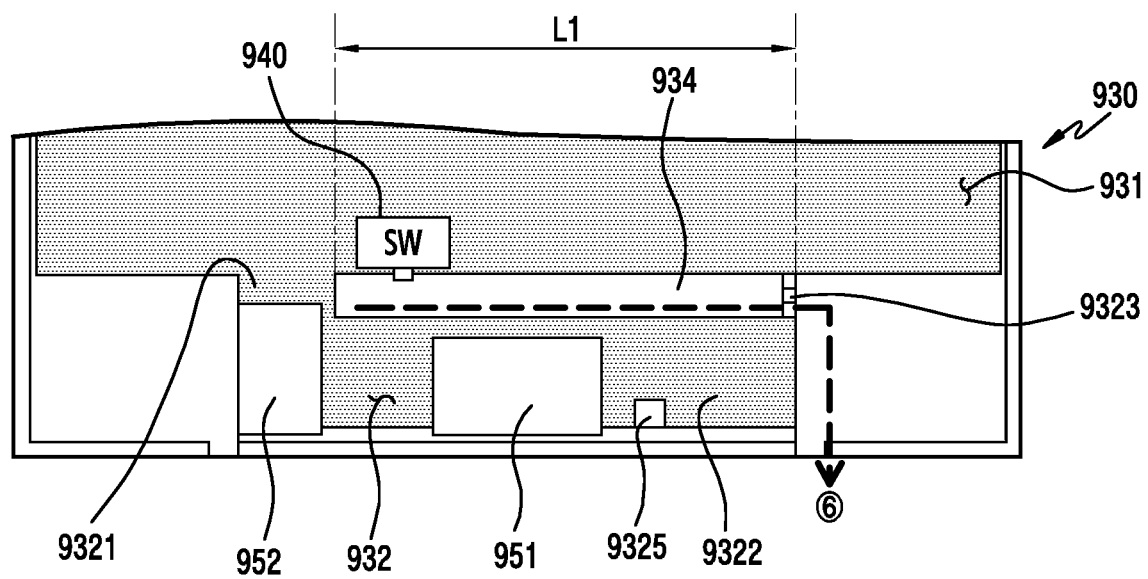
FIGS. 9A and 9B are views of an antenna including a switching device according to an embodiment of the present disclosure.
Figure 9B:
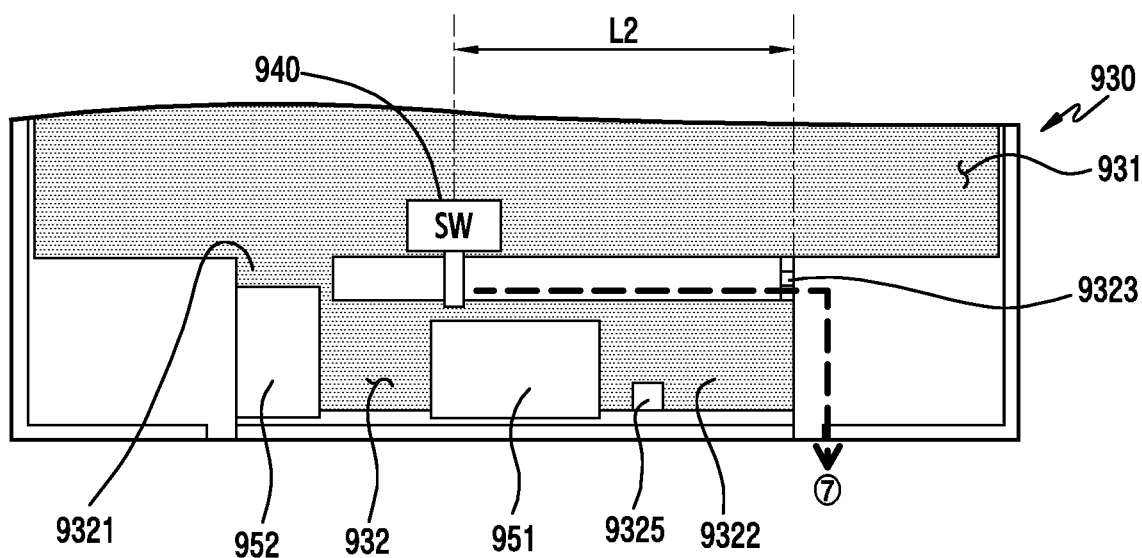

FIGS. 9A and 9B are views of an antenna including a switching device according to an embodiment of the present disclosure.

A board 930 in FIGS. 9A and 9B may be similar to the board 930 of FIGS. 5A and 5B or the board 630 of FIGS. 6A and 6B, or may include another embodiment of the board.

Referring to FIGS. 9A and 9B, the configuration of the housing coupled with the board 930 and the configuration of the antenna that operates by being coupled with the housing are omitted since they are the same as or similar to the those described above with reference to FIG. 6A, and only the configuration of the board 930 is illustrated.

According to various embodiments, the board 930 may include a main ground plane 931 and a ground extension 932 extending from the main ground plane 931. The ground extension 932 may extend from the main ground plane 931 in an L shape. The ground extension 932 may include a first portion 9321 extending downward from the main ground plane 931 and a second portion 9322 extending rightward from the first portion 9321. The board 930 may include a board slit 934 having a predetermined length and a predetermined width, which are formed by the main ground plane 931 and the second portion 9322. One or more conductive electronic components 951 and 952 may be mounted on the second portion 9322, and the conductive electronic components 951 and 952 may also operate as a part of an antenna radiator.

According to an embodiment of the present disclosure, the board 930 may include a power feeding portion 9323 electrically connected to the second portion 9322 via a communication circuit. The board 930 may come into physical contact with the contact point CP of the housing (e.g., the housing 610 of FIG. 6A), thereby being electrically connected to the contact point CP, in which the contact point CP is mounted by mounting an electrical connector 9325 in another region of the second portion 9322, which is spaced apart from the power feeding portion 9323.

According to an embodiment of the present disclosure, the board 930 may include a switching device 940 that is mounted in order to adjust the electrical length of the board slit 934 to be used as a slit antenna. The switching device 940 is installed in place in the board slit 934 so as to selectively electrically connect the main ground plane 931 and the second portion 9322 of the ground extension 932. The switching device 940 may be controlled via a processor (or a communication circuit) of the electronic device.

Referring to FIG. 9A, when the switching device 940 is turned off, the antenna includes a radiation current path (⑥ in FIG. 9A) having an electrical length of L1, which is the entire length of the board slit 934 from the power feeding portion 9323, so that the antenna may operate in the first low band. Referring to FIG. 9B, when the switching device 940 is turned on, the antenna includes a radiation current path (⑦ in FIG. 9B) having an electrical length L2 of the length which is the length from the power feeding portion 9323 of the board slit 934 to the switching device 940, so that the antenna may operate in the second low band.

Figure 9C:
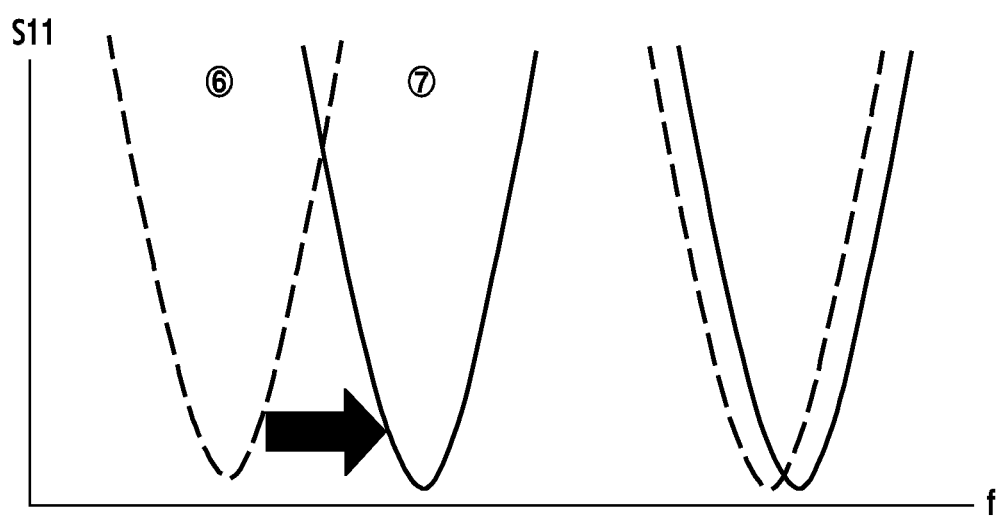
FIG. 9C is a graph illustrating a change in an operating frequency band of an antenna according to an electrical length of a slit, which is variable by an operation of a switching device according to an embodiment of the present disclosure.

FIG. 9C is a graph illustrating a change in an operating frequency band of an antenna according to an electrical length of a slit, which is variable by an operation of a switching device according to an embodiment of the present disclosure.

Referring to FIG. 9C, the operating frequency band of the antenna is changed in the low band through the switching device 940 of the antenna. For example, in the case of the antenna operating in the low band, when the electrical length of the board slit is shortened by the switching device 940, the changed width of the operating frequency band from a relatively low frequency band to a relatively high frequency band is greater than the changed width of the operating frequency band from a relatively low frequency band to a relatively high frequency band in the high band in the same condition.

Figure 10A:
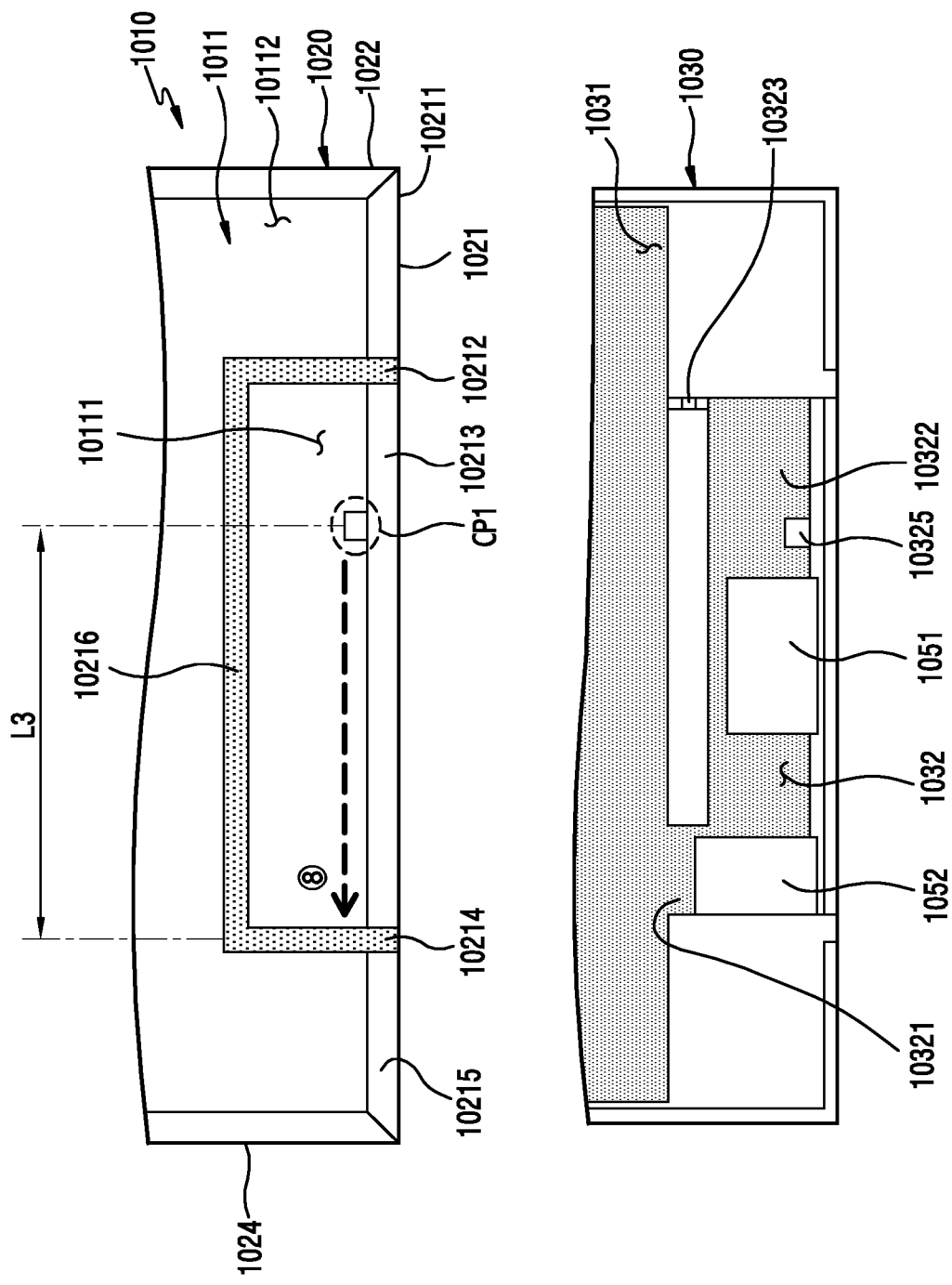
FIGS. 10A and 10B are views of an antenna including a switching device according to an embodiment of the present disclosure.
Figure 10B:
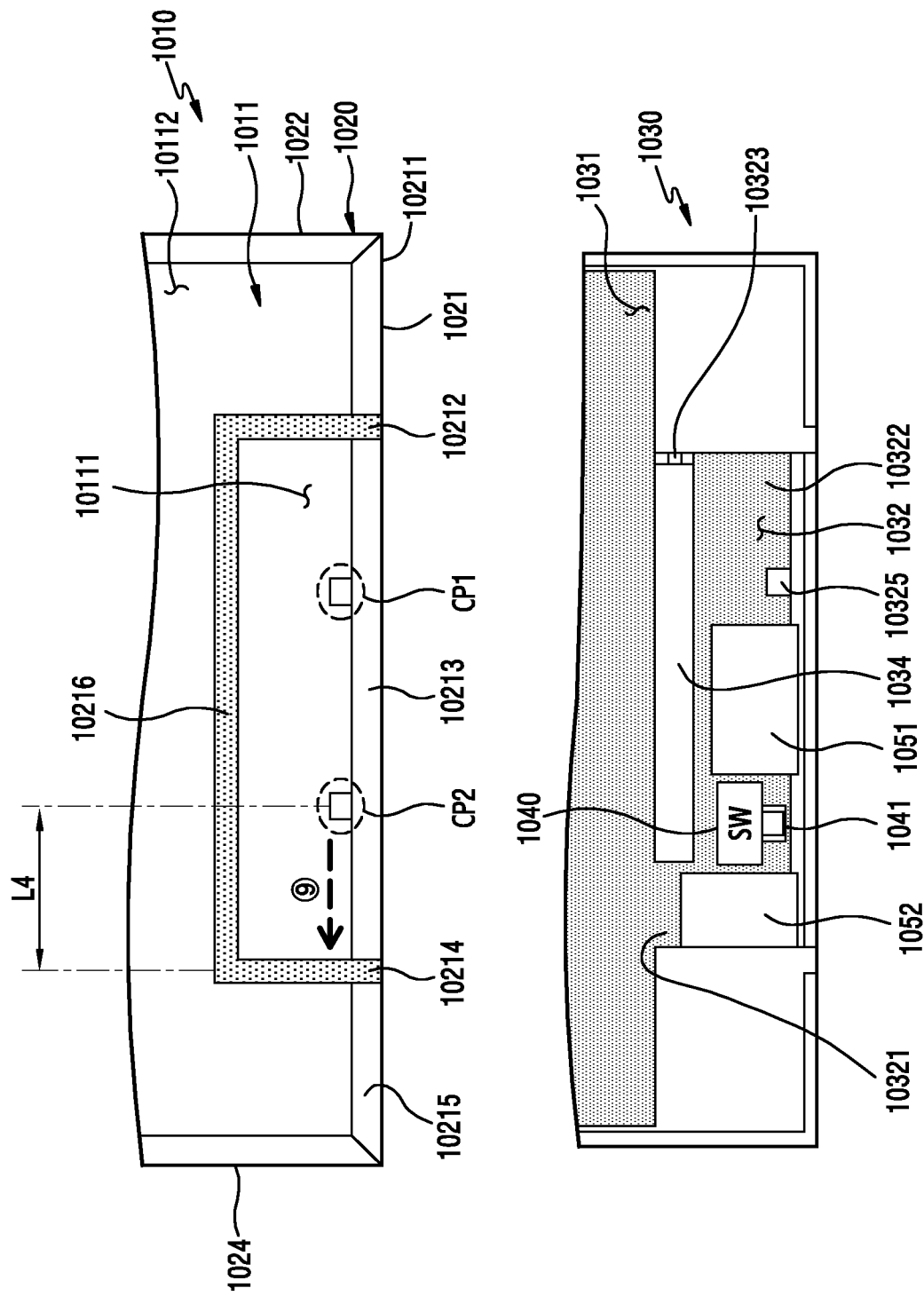

FIGS. 10A and 10B are configuration views of an antenna including a switching device according to various embodiments of the present disclosure.

A board 1030 and a housing 1010 of FIGS. 10A and 10B may be similar to the board 530 and the housing 510 of FIGS. 5A and 5B or the board 630 and the housing 610 of FIGS. 6A and 6B, or may include another embodiment of the board and the housing.

Referring to FIGS. 10A and 10B, the housing 1010 may include a second plate 1011, which at least partially includes a metallic material and a side member 1020 which is disposed along the peripheral edge of the second plate 1011 to have a predetermined height. According to one embodiment, the second plate 1011 may be formed integrally with the side member 1020. The side member 1020 (e.g., the side member 310 of FIG. 3B) includes a first side face 1021, a second side face 1022, a third side face, and a fourth side face 1024. The first side face 1021 may include a first conductive portion 10211, a first non-conductive portion 10212, a second conductive portion 10213, a second non-conductive portion 10214, and a third conductive portion 10215, which are sequentially disposed between the second side face 1022 and the fourth side face 1024. The second plate 1011 may include a first non-conductive slit 10216, which surrounds a first conductive region 10111 together with the second conductive portion 10213 when viewed from the upper side of the second plate 1011 and extends from the first non-conductive portion 10212 to the second non-conductive portion 10214. The second plate 1011 is divided, by a first non-conductive slit 10216, into a first conductive region 10111 that operates as an antenna radiator and a second conductive region 10112 that operates as a ground.

According to an embodiment of the present disclosure, the board 1030 coupled to the above-mentioned housing 1010 may include a main ground plane 1031 and a ground extension 1032 disposed between the first conductive region 10111 of the second plate 1011 and the first side face 1021. The ground extension 1032 may extend from the main ground plane 1031 in an L shape. The ground extension 1032 may include a first portion 10321 extending from the main ground plane 1031 toward the first side face 1021 and a second portion 10322 extending from the first portion 10321 toward the second side face 1022. The board 1030 may include a board slit 1034 having a predetermined length and a predetermined width, which are formed by the main ground plane 1031 and the second portion 10322. One or more conductive electronic components 1051 and 1052 may be mounted on the second portion 10322, and the conductive electronic components 1051 and 1052 may also operate as a part of an antenna radiator.

According to an embodiment of the present disclosure, the board 1030 may include a power feeding portion 10323 electrically connected to the second portion 10322 via a communication circuit. The board 1030 may come into physical contact with a first contact point CP1 of the housing 1010, thereby being electrically connected to the first contact point CP1, in which the contact point CP1 is mounted by mounting a first electrical connector 10325 in another region of the second portion 10322, which is spaced apart from the power feeding portion 10323.

According to an embodiment of the present disclosure, the board 1030 may include a switching device 1040 disposed to change the contact point of the first conductive region 10111 of the housing 1010. The switching device 1040 is disposed at a position where a second electrical connector 1041 is mounted in the second portion 10322 of the board 1030, so that when the housing 1010 and the board 1030 are coupled to each other, the switching device 1040 may selectively operate as a second contact point CP2. The switching device 1040 may be controlled via a processor (or a communication circuit) of the electronic device.

Referring to FIG. 10A, when the switching device 1040 is turned off, the antenna includes a radiation current path (⑧ in FIG. 10A) having an electrical length of L3, which is the length from the first contact point CP1 to the second non-conductive portion 10214 of the housing 1010, so that the antenna may operate in the first mid band.

Referring to FIG. 10B, when the switching device 1040 is turned on, the antenna includes a radiation current path (⑨ in FIG. 10B) having an electrical length of L4, which is the length from the second contact point CP2 to the second non-conductive portion 10214 of the housing 1010, so that the antenna may operate in the second mid band.

Figure 10C:
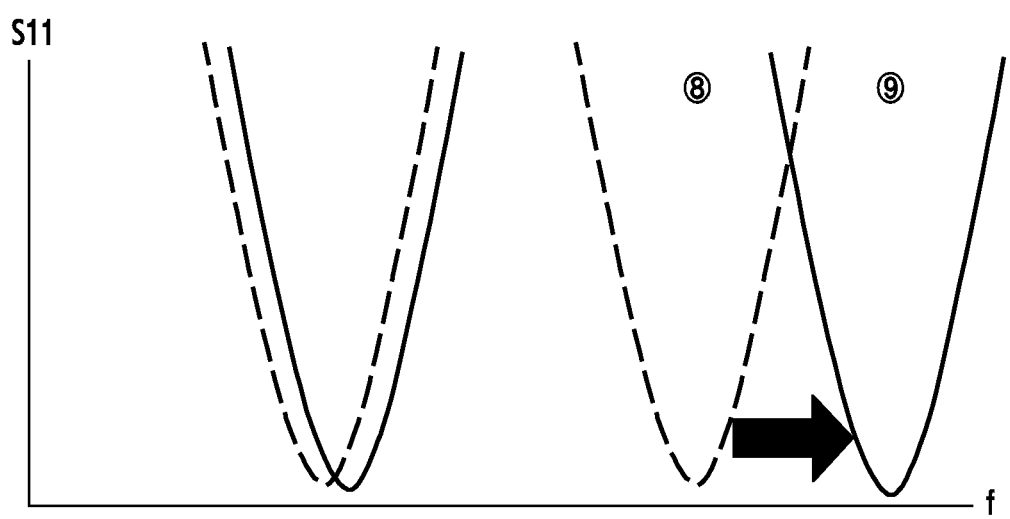
FIG. 10C is a graph illustrating a change in an operating frequency band of an antenna according to an electrical length of a first conductive region of a housing, which is variable by an operation of a switching device according to an embodiment of the present disclosure.

FIG. 10C is a graph illustrating a change in an operating frequency band of an antenna according to an electrical length of a first conductive region of a housing, which is variable by an operation of a switching device according to an embodiment of the present disclosure.

Referring to FIG. 10C, the operating frequency band of the antenna is changed in the mid band through the switching device 1040 of the antenna. For example, in the case of the antenna operating in the low band, when the electrical length of the first conductive region 10111 of the housing 1010 is shortened by the switching device 1040, that is, as the contact point approaches from the second non-conductive region 10214, the changed width of the operating frequency band from a relatively low frequency band to a relatively high frequency band is greater than the changed width in the low band.

Figure 11A:
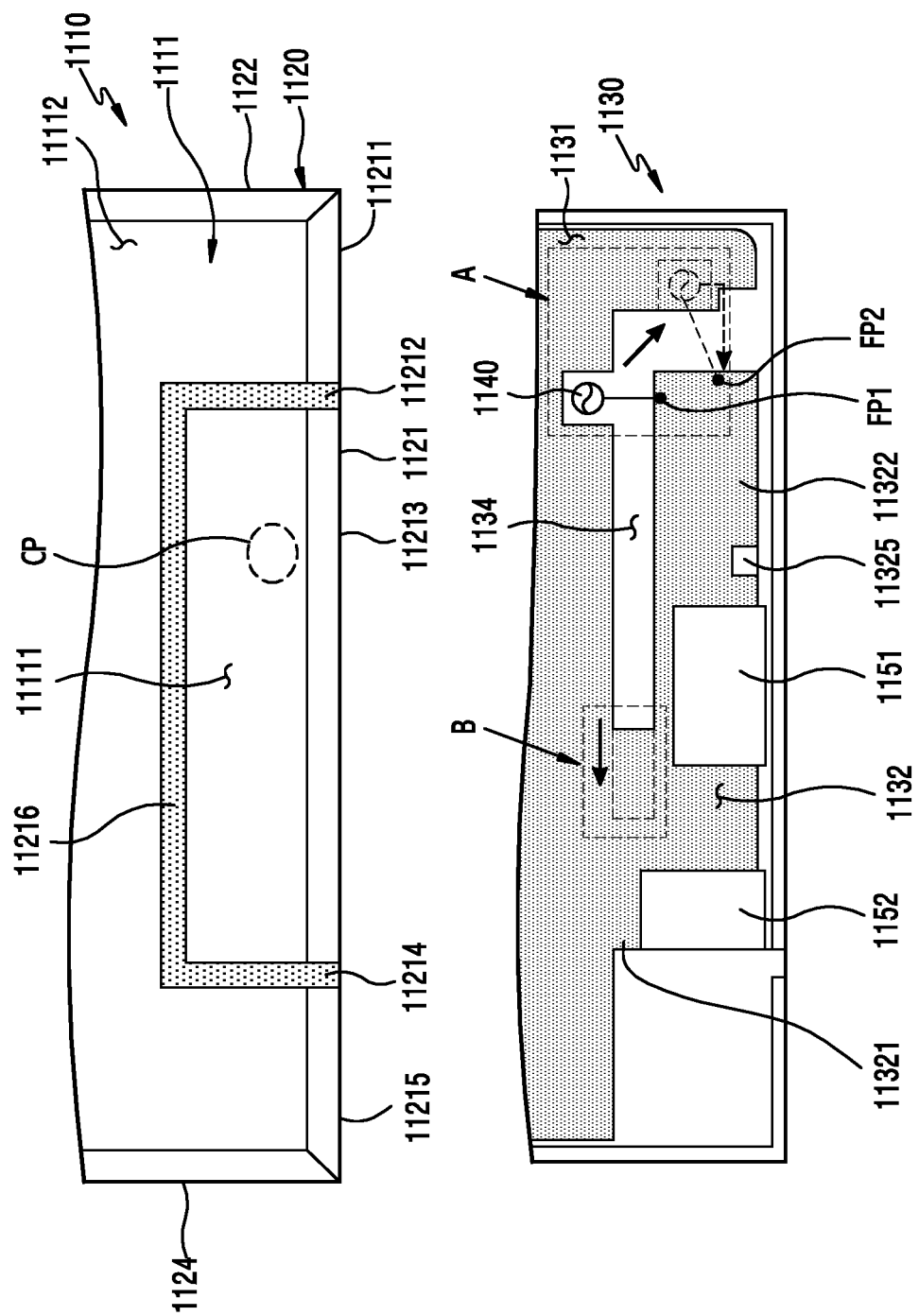
FIG. 11A is a view of an antenna illustrating a change in power feeding point of a board and a change in length of a slit according to an embodiment of the present disclosure.

FIG. 11A is a view of an antenna illustrating a change in power feeding point of a board and a change in length of a slit according to an embodiment of the present disclosure.

Referring to FIG. 11A, a housing 1110 and a board 1130 may include an embodiment that is similar to, or different from, the housing 4001 and the board 4002 of FIG. 4. FIG. 11A is an illustration of the expansion of the board slit 1134 in the board 1130 and the change of the power feeding position (from FP1 to FP2).

The housing 1110 may include a second plate 1111 which at least partially includes a metallic material and a side member 1120 which is disposed along the peripheral edge of the second plate 1111 to have a predetermined height. According to one embodiment, the second plate 1111 may be formed integrally with the side member 1120. The side member 1120 (e.g., the side member 310 of FIG. 3B) includes a first side face 1121, a second side face 1122, a third side face, and a fourth side face 1124. The first side face 1121 may include a first conductive portion 11211, a first non-conductive portion 11212, a second conductive portion 11213, a second non-conductive portion 11214, and a third conductive portion 11215, which are sequentially disposed between the second side face 1122 and the fourth side face 1124. The second plate 1111 may include a first non-conductive slit 11216, which surrounds a first conductive region 11111 together with the second conductive portion 11213 when viewed from the upper side of the second plate 1111 and extends from the first non-conductive portion 11212 to the second non-conductive portion 11214. The second plate 1111 is divided, by a first non-conductive slit 11216, into a first conductive region 11111 that operates as an antenna radiator and a second conductive region 11112 that operates as a ground.

According to one embodiment, the board 1130 coupled to the above-mentioned housing 1110 may include a main ground plane 1131 and a ground extension 1132 disposed between the first conductive region 11111 of the second plate 1111 and the first side face 1121. The ground extension 1132 may extend from the main ground plane 1131 in an L shape. The ground extension 1132 may include a first portion 11321 extending from the main ground plane 1131 toward the first side face 1121 and a second portion 11322 extending from the first portion 11321 toward the second side face 1122. The board 1130 may include a board slit 1134 having a predetermined length and a predetermined width, which are formed by the main ground plane 1131 and the second portion 11322. One or more conductive electronic components 1151 and 1152 may be mounted on the second portion 11322, and the conductive electronic components 1151 and 1152 may also operate as a part of an antenna radiator.

According to an embodiment of the present disclosure, the board 1130 may include the first power feeding point FP1 that is electrically connected to the second portion 11322 via a communication circuit 1140 (e.g., a power feeding portion). The board 1130 may come into physical contact with the contact point CP of the housing 1110, thereby being electrically connected to the contact point CP, in which the contact point CP is mounted by mounting an electrical connector 11325 in another region of the second portion 11322, which is spaced apart from the first power feeding point FP1.

According to an embodiment of the present disclosure, the antenna may change the power feeding point from the first feeding point FP1 to the second feeding point FP2 as illustrated in region A, or the operating frequency band in the low band of the antenna may be changed in the manner of extending the length of the board slit 1134 as illustrated in region B. In the case of region A, when the power feeding point is changed from the first feeding point FP1 to the second feeding point FP2, the electrical length of the antenna in the low band may increase in the direction indicated by a dotted line arrow so that the operating frequency band can be moved to a relatively low frequency band. According to one embodiment, in the case of region B, when the length of the board slit 1134 increases, the electrical length of the antenna in the low band increases in the direction indicated by a solid line arrow so that the operating frequency band can be moved to a relatively low frequency band.

Figure 11B:
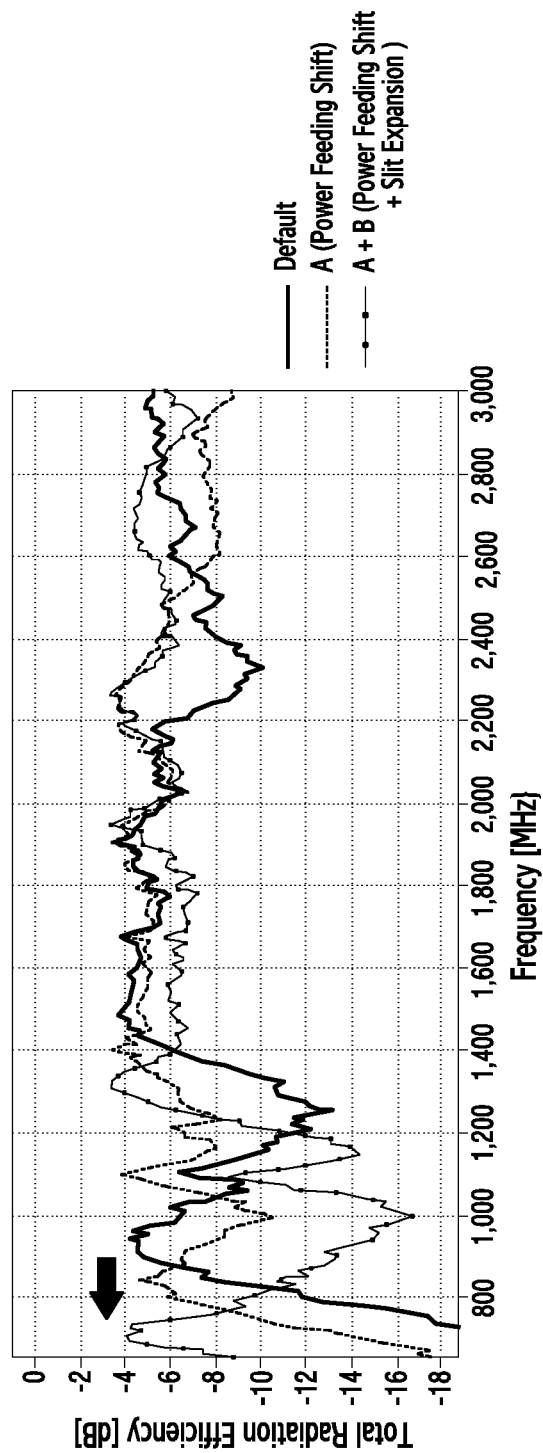
FIG. 11B is a graph illustrating a change in an operating frequency band of an antenna according to a change in a power feeding point or a length of the slit of FIG. 11A according to an embodiment of the present disclosure.

FIG. 11B is a graph illustrating a change in an operating frequency band of an antenna according to a change in a power feeding point or a length of a board slit of FIG. 11A according to an embodiment of the present disclosure.

Referring to FIG. 11B, in the case where the power feeding position is shifted (in the case of region A) compared to the case where the length of the board slit 1134 or the power feeding position FP1 is not changed, the operating frequency band of the antenna is moved to a relatively low frequency band in the low band. For example, in the case where the power feeding position is shifted (from FP1 to FP2) (in the case of region A), when the board slit 1134 is also expanded (in the case of region B), the operating frequency band of the antenna is moved to a relatively lower frequency band in the low band.

Figure 12A:
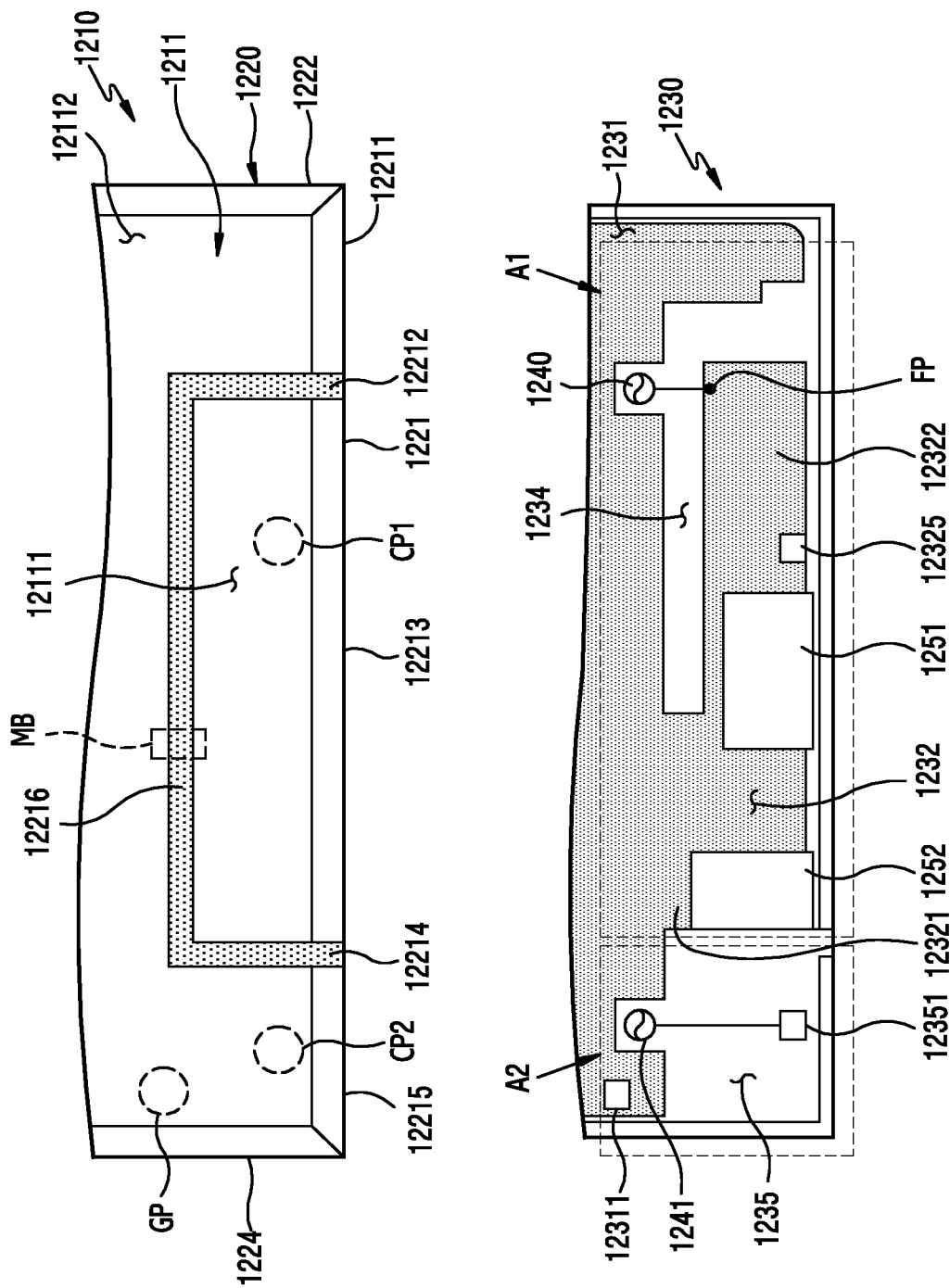
FIG. 12A is a view of an additional antenna that operates by a separate additional power feeding in addition to a slit antenna of a board according to an embodiment of the present disclosure.

FIG. 12A is a view of an additional antenna that operates by a separate additional power feeding in addition to a slit antenna of a board according to various embodiments of the present disclosure.

Referring to FIG. 12A, a housing 1210 and a board 1230 may be similar to the housing 4001 and the board 4002 of FIG. 4, or may include another embodiment of the housing and the board.

The housing 1210 may include a second plate 1211 which at least partially includes a metallic material and a side member 1220 which is disposed along the peripheral edge of the second plate 1211 to have a predetermined height. According to one embodiment, the second plate 1211 may be formed integrally with the side member 1220. The side member 1220 (e.g., the side member 310 of FIG. 3B) includes a first side face 1221, a second side face 1222, a third side face, and a fourth side face 1224. The first side face 1221 may include a first conductive portion 12211, a first non-conductive portion 12212, a second conductive portion 12213, a second non-conductive portion 12214, and a third conductive portion 12215, which are sequentially disposed between the second side face 1222 and the fourth side face 1224. The second plate 1211 may include a first non-conductive slit 12216, which surrounds a first conductive region 12111 together with the second conductive portion 12213 when viewed from the upper side of the second plate 1211 and extends from the first non-conductive portion 12212 to the second non-conductive portion 12214. The second plate 1211 is divided, by a first non-conductive slit 12216, into a first conductive region 12111 that operates as an antenna radiator and a second conductive region 12112 that operates as a ground.

According to an embodiment of the present disclosure, the board 1230 coupled to the above-mentioned housing 1210 may include a main ground plane 1231 and a ground extension 1232 disposed between the first conductive region 12111 of the second plate 1211 and the first side face 1221. According to one embodiment, the ground extension 1232 may extend from the main ground plane 1231 in an L shape. The ground extension 1232 may include a first portion 12321 extending from the main ground plane 1231 toward the first side face 1221 and a second portion 12322 extending from the first portion 12321 toward the second side face 1222. The board 1230 may include a board slit 1234 having a predetermined length and a predetermined width, which are formed by the main ground plane 1231 and the second portion 12322. One or more conductive electronic components 1251 and 1252 may be mounted on the second portion 12322, and the conductive electronic components 1251 and 1252 may operate as a part of an antenna radiator.

According to an embodiment of the present disclosure, the board 1230 may include a power feeding point FP that is electrically connected to the second portion 12322 via a first communication circuit 1240 (e.g., first a power feeding portion). The board 1230 may come into physical contact with a first contact point CP1, which is disposed in the first conductive region 12111 of the housing 1210, thereby being electrically connected to the first contact point CP1, in which the first contact point CP1 is mounted by mounting a first electrical connector 12325 in another region of the second portion 12322, which is spaced apart from the power feeding point FP.

According to an embodiment of the present disclosure, the board 1230 may include a fill-cut region 1235, which is a non-conductive region. The fill-cut region 1235 may be formed in a region of the board 1230 that overlaps with a partial region of the second conductive region 12112 of the housing 1210. However, without being limited thereto, the fill-cut region 1235 may be disposed at various positions where a margin space for the board 1230 is allowed. A second electrical connector 12351, which is electrically connected via a second communication circuit 1241 (e.g., a second power feeding portion), may be mounted on the fill-cut region 1235 of the board 1230. The second electrical connector 12351 may be electrically connected to a second contact point CP2 disposed at a corresponding position in the second conductive area 12112 of the housing 1210 to be mounted by coming into physical contact with the second contact point CP2.

According to various embodiments, a third electrical connector 12311 may be mounted in place of the main ground plane 1231 of the board 1230, and may be electrically connected to the housing 1210 via a ground point GP disposed at a corresponding position in the housing 1210. The first non-conductive slit 12216 may further include a metal bridge MB formed to electrically connect the first conductive region 12111 and the second conductive region 12112 of the second plate 1211. The metal bridge MB may perform an isolation function in order to exclude mutual interference in radiation operation between the antenna of region A1 and the antenna of region A2.

In an embodiment of the present disclosure, the electronic device may include an antenna region (region A1) operating in multiple bands by a board slit 1234 and by a first contact point CP1 and an antenna region (region A2) operating by the second contact point CP2. According to one embodiment, region A2 may include a third conductive portion 12215 of the first side face 1221, which is electrically connected to the second communication circuit 1241, and a planar inverted F antenna (PIFA), which operates as an antenna radiator by a ground point GP by a third electrical connector 12311, which determines the electrical length. The antenna operating in region A1 can operate in multiple bands in a low band and a mid band, and the antenna operating in region A2 may operate in a relatively high band.

Figure 12B:
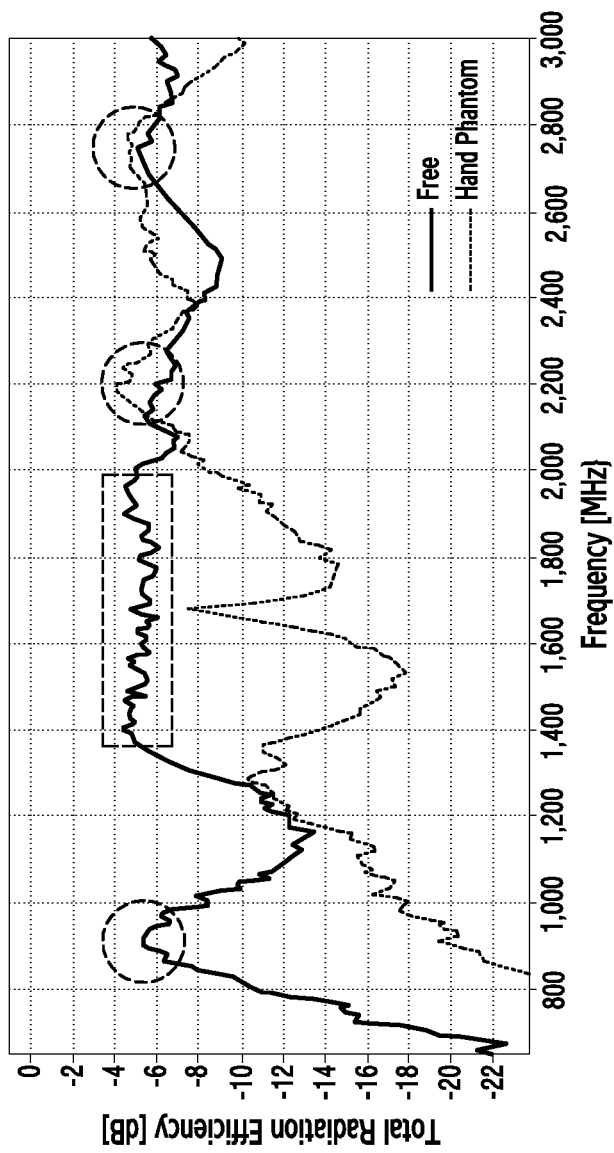
FIG. 12B is a graph representing an operating frequency band of an antenna formed as illustrated in FIG. 12A according to an embodiment of the present disclosure.

FIG. 12B is a graph illustrating an operating frequency band of an antenna formed as illustrated in FIG. 12A according to an embodiment of the present disclosure. An antenna operating in region A1 of the board mainly operate in a low band of less than 1 GHz and a mid band having a range of 1.7 GHz to 2.2 GHz, and that the antenna operating in region A2 region in the board mainly operates in the high band ranging from 2.2 GHz to 2.7 GHz.

Figure 13A:
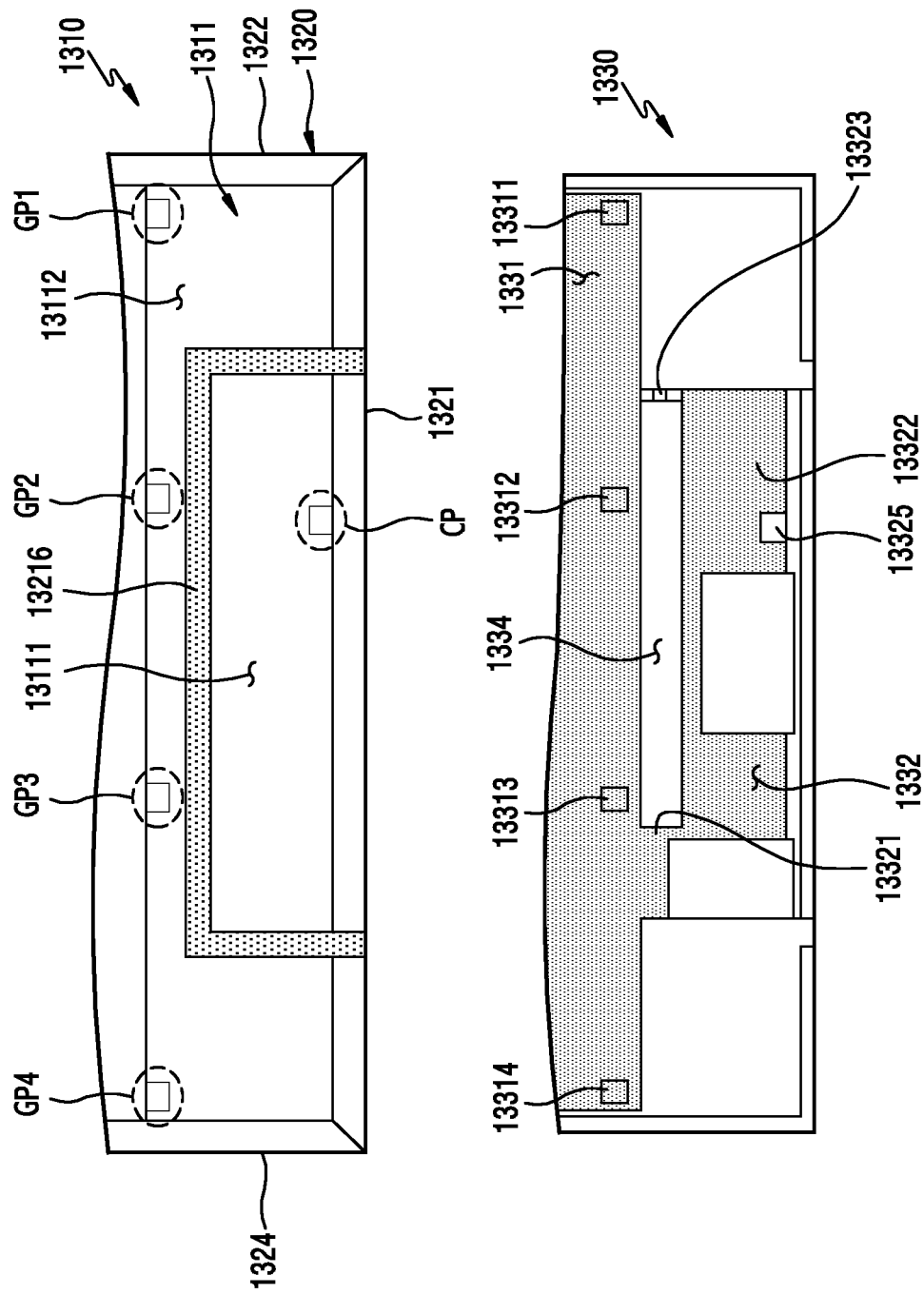
FIGS. 13A and 13B are views each illustrating an arrangement relationship of a plurality of ground points between a board and a housing according to an embodiment of the present disclosure.
Figure 13B:
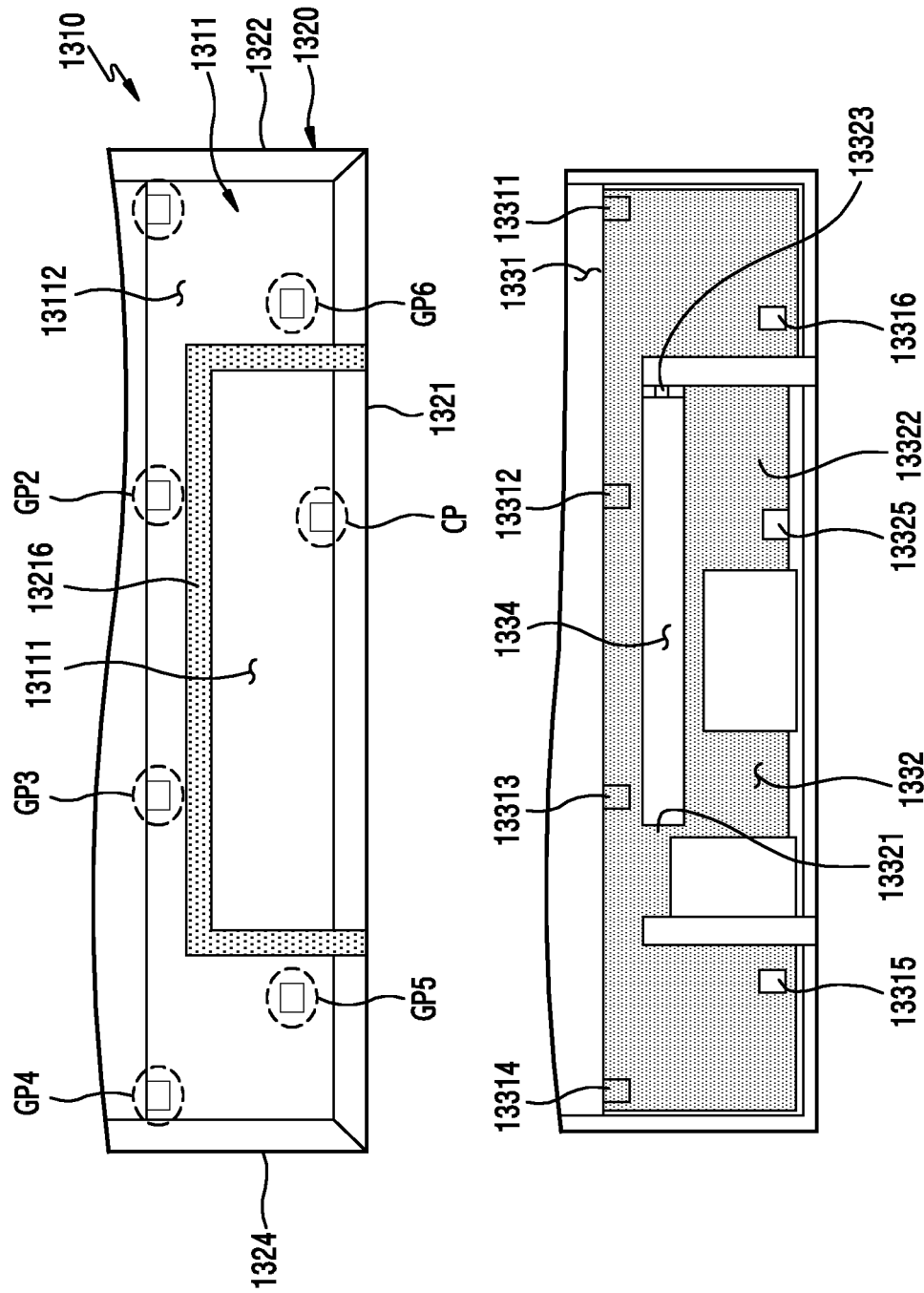

FIGS. 13A and 13B are views each illustrating an arrangement relationship of a plurality of ground points between a board and a housing according to an embodiment of the present disclosure of the present disclosure.

Referring to FIGS. 13A and 13B, a housing 1310 and a board 1330 may be similar to the housing 4001 and the board 4002 of FIG. 4, or may include another embodiment of the housing and the board.

The housing 1310 may include a second plate 1311, which at least partially includes a metallic material and a side member 1320 which is disposed along the peripheral edge of the second plate 1311 to have a predetermined height. According to one embodiment, the second plate 1311 may be formed integrally with the side member 1320. The side member 1320 (e.g., the side member 310 of FIG. 3B) includes a first side face 1321, a second side face 1322, a third side face, and a fourth side face 1324. The second plate 1311 may be divided into a first conductive region 13111 and a second conductive region 13112 by a first non-conductive slit 13216, which is disposed in the second plate 1311 and has opposite ends extending to the first side face 1321. The first conductive region 13111 may include a region in which the second plate 1311 and the first side face 1321 extend.

According to an embodiment of the present disclosure, the board 1330 coupled to the above-mentioned housing 1310 may include a main ground plane 1331 and a ground extension 1332 disposed between the first conductive region 13111 of the second plate 1311 and the first side face 1321. The ground extension 1332 may extend from the main ground plane 1331 in an L shape. The ground extension 1332 may include a first portion 13321 extending from the main ground plane 1331 toward the first side face 1321 and a second portion 13322 extending from the first portion 13321 toward the second side face 1322. The board 1330 may include a board slit 1334 having a predetermined length and a predetermined width, which are formed by the main ground plane 1331 and the second portion 13322.

According to an embodiment of the present disclosure, the board 1330 may include a power feeding portion 13323 electrically connected to the second portion 13322 via a communication circuit. The board 1330 may come into physical contact with a contact point of the housing 1310, which is disposed in the first conductive region 13111 of the housing 1310, thereby being electrically connected to the contact point CP, in which the contact point CP is mounted by mounting an electrical connector 13325 in another region of the second portion 13322, which is spaced apart from the power feeding point FP. The electrical connector 13325 may include a C-clip, a conductive tape, or a conductive pad.

According to an embodiment of the present disclosure, the housing 1310 at least partially including a metallic material may be used as an expanded ground element by being electrically connected with the main ground plane 1331 of the board 1330. A plurality of ground points GP1, GP2, GP3, GP4, GP5, and GP6 may be disposed in the second conductive region 13112 of the housing 1310. The board 1330 includes a plurality of electrical connectors 13311, 13312, 13313, 13314, 13315, and 13316, which are respectively disposed at positions corresponding to the ground points GP1, GP2, GP3, GP4, GP5, and GP6 of the housing 1310. Each of the plurality of electrical connectors 13311, 13312, 13313, 13314, 13315, and 13316 may include a C-clip, a conductive tape, or a conductive pad.

According to an embodiment of the present disclosure, the electronic device may have enhanced ground performance by being electrically connected to the corresponding ground points GP1, GP2, GP3, GP4, GP5, and GP6 of the housing by the plurality of electrical connectors 13311, 13312, 13313, 13314, 13315, and 13316. However, the present disclosure is not limited thereto, and the change or expansion of a bandwidth can be achieved by adjusting the electrical length of the antenna according to the position of at least one ground point among the ground points GP1, GP2, GP3, GP4, GP5, and GP6.

Figure 14:
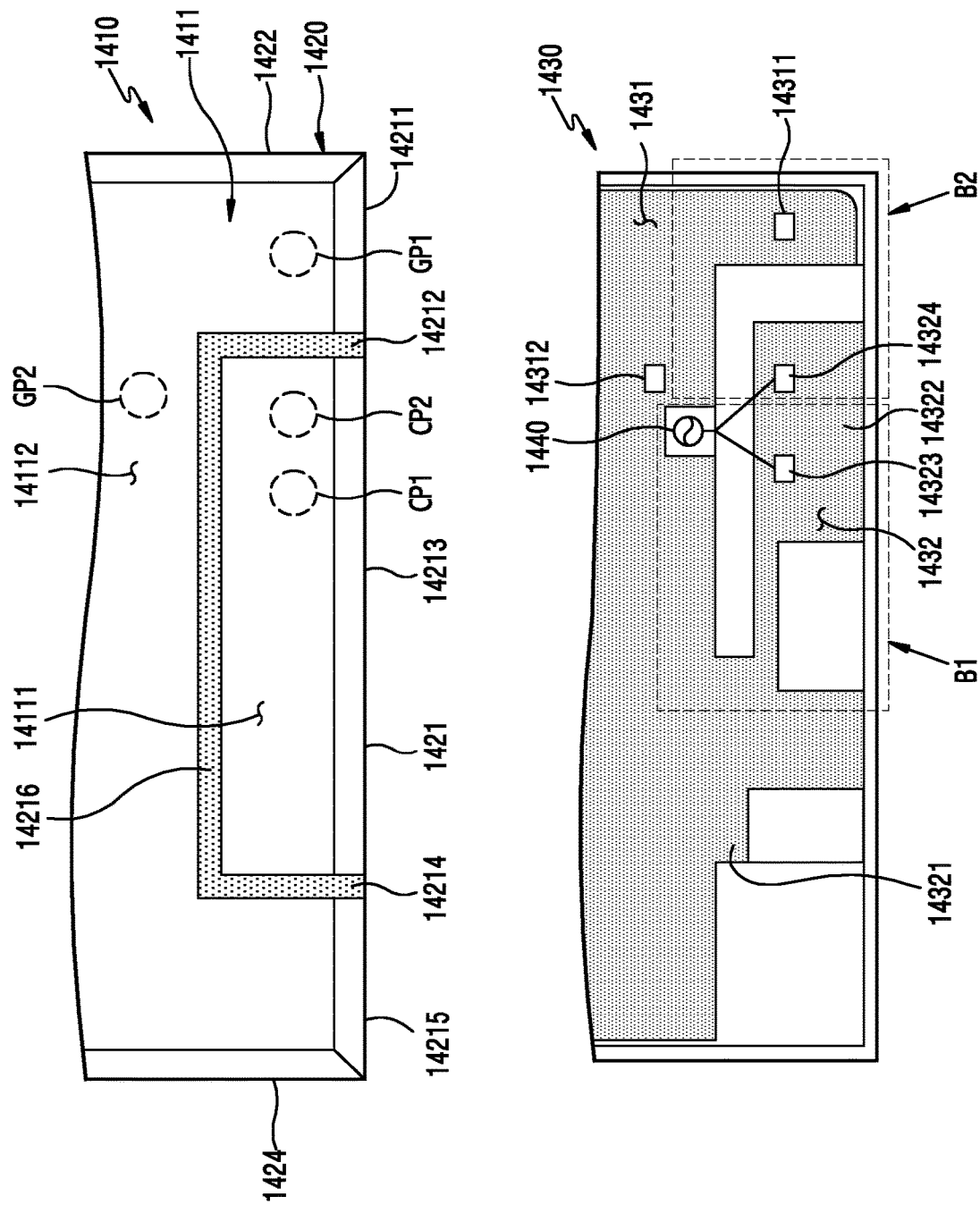
FIG. 14 is a view illustrating a configuration of a slit antenna using dual power feeding according to an embodiment of the present disclosure.

FIG. 14 is a view illustrating a configuration of a slit antenna using dual power feeding according to an embodiment of the present disclosure.

Referring to FIG. 14, a housing 1410 and a board 1430 may be similar to the housing 4001 and the board 4002 of FIG. 4, or may include another embodiment of the housing and the board.

The housing 1410 may include a second plate 1411 which at least partially includes and a side member 1420 which is disposed along the peripheral edge of the second plate 1411 to have a predetermined height. According to one embodiment, the second plate 1411 may be formed integrally with the side member 1420. The side member 1420 (e.g., the side member 310 of FIG. 3B) includes a first side face 1421, a second side face 1422, a third side face, and a fourth side face 1424. The first side face 1421 may include a first conductive portion 14211, a first non-conductive portion 14212, a second conductive portion 14213, a second non-conductive portion 14214, and a third conductive portion 14215, which are sequentially disposed between the second side face 1422 and the fourth side face 1424. The second plate 1411 may include a first non-conductive slit 14216, which surrounds a first conductive region 14111 together with the second conductive portion 14213 when viewed from the upper side of the second plate 1411 and extends from the first non-conductive portion 14212 to the second non-conductive portion 14214. The second plate 1411 is divided, by a first non-conductive slit 14216, into a first conductive region 14111 that operates as an antenna radiator and a second conductive region 14112 that operates as a ground.

According to one embodiment, the board 1430 coupled to the above-mentioned housing 1410 may include a main ground plane 1431 and a ground extension 1432 disposed between the first conductive region 14111 of the second plate 1411 and the first side face 1421. The ground extension 1432 may extend from the main ground plane 1431 in an L shape. The ground extension 1432 may include a first portion 14321 extending from the main ground plane 1431 toward the first side face 1421 and a second portion 14322 extending from the first portion 14321 toward the second side face 1422. The board 1430 may include a board slit 1434 having a predetermined length and a predetermined width, which are formed by the main ground plane 1431 and the second portion 14322.

According to an embodiment of the present disclosure, the board 1430 may include a first electrical connector 14323 and a second electrical connector 14324 which are electrically connected to each other via a communication circuit 1440 (e.g., a feeding portion) in the second portion 14322. According to one embodiment, the first electrical connector 14323 and the second electrical connector 14324 may be disposed at mutually different positions in the second portion 14322 of the board 1430. The housing 1410 is coupled to the board 1430, the first electrical connector 14323 and the second electrical connector 14324 are electrically connected to the first contact point CP1 and the second contact point CP2 of housing 1410, respectively. According to one embodiment, a third electrical connector 14311 and a fourth electrical connector 14312 may be mounted on the main ground plane 1431 of the board 1430, and when the housing 1410 and the board 1430 are coupled to each other, the third electrical connector 14311 and the fourth electrical connector 14312 can be electrically connected to the first ground point GP1 and the second ground point GP2 of the housing 1410, respectively.

According to an embodiment of the present disclosure, a slit antenna structure formed by the first non-conductive slit 14216 has an electrical length (the width and height length of the first conductive region 14111 formed by the non-conductive slit) that may efficiently resonate in the low band, but may require an additional structure to operate in the relatively high frequency band in comparison with an existing non-conductive slit. This additional structure may include a structure that dually feeds power to mutually different regions of the board 1430 in a single communication circuit 1440 (e.g., a feeding portion). In this case, as illustrated in FIG. 14, the antenna may be implemented to operate in a low band in the antenna region B1, and may operate in the mid band and high band in the antenna region B2.

Figure 15A:
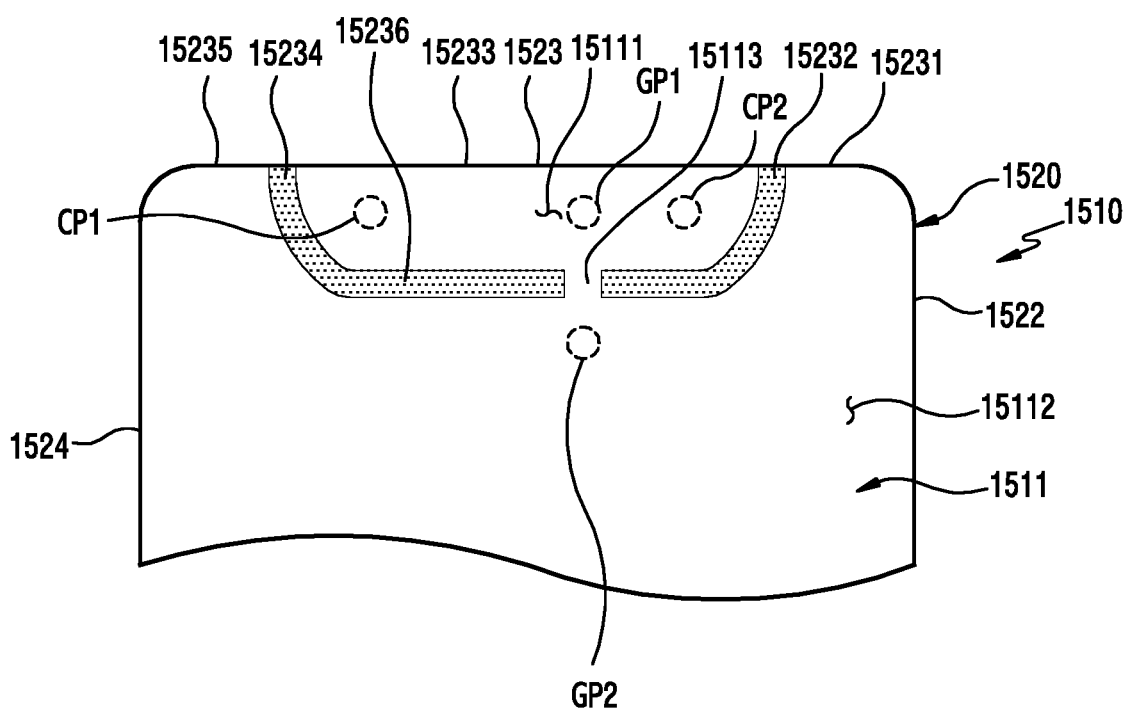
FIGS. 15A and 15B are views each illustrating an antenna including a non-conductive slit in which a metal bridge according to an embodiment of the present disclosure is formed.
Figure 15B:
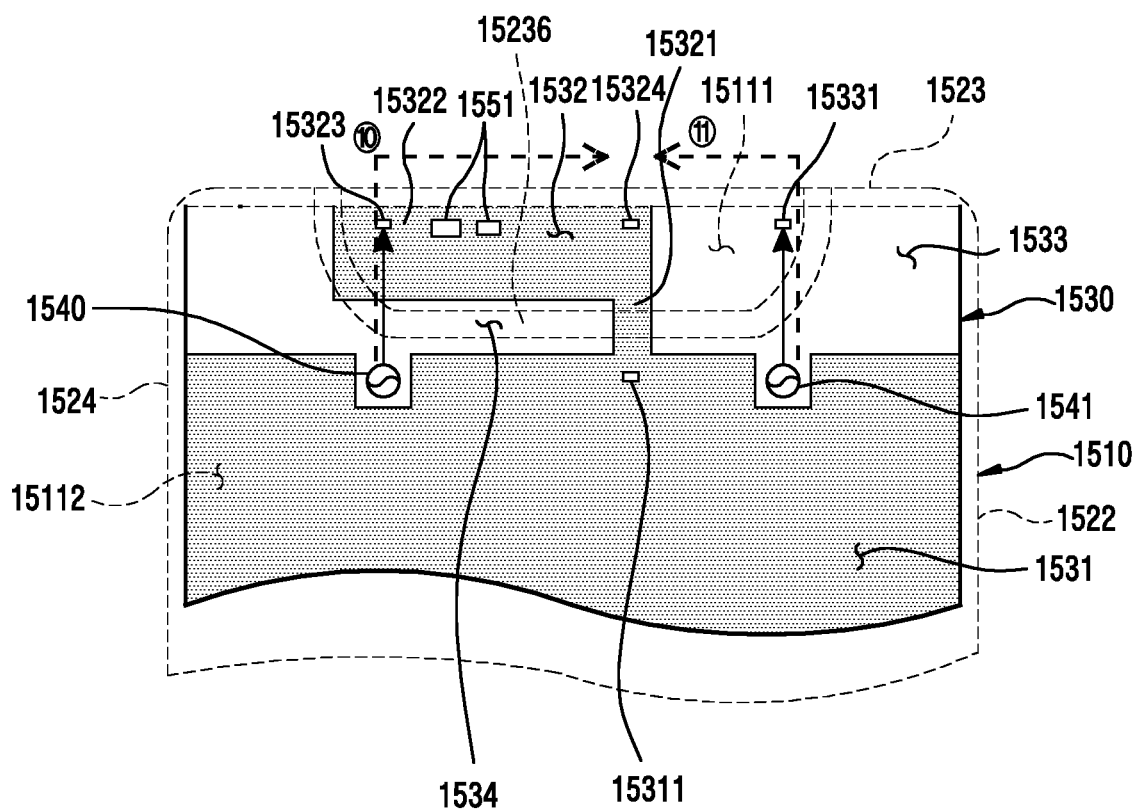

FIGS. 15A and 15B are views each illustrating an antenna including a non-conductive slit in which a metal bridge according to an embodiment of the present disclosure is formed.

Referring to FIGS. 15A and 15B, the housing 1510 of FIG. 15A may be similar to the housing 310 of FIGS. 3A and 3B or the housing 410 of FIG. 4, or may include another embodiment of the housing. The board 1530 in FIG. 15B may be similar to the board 4002 of FIG. 4, or may include another embodiment of the board.

A second non-conductive slit 15236 disposed around a third side face 1523 of a second plate 1511 of the housing 1510 is illustrated and described, but the present disclosure is not limited thereto. For example, the second non-conductive slit 15236 may be disposed around a first side face, which is opposite to the third side face 1523 of the housing 1510, or may be disposed both of the third side face 1523 and the first side face.

The housing 1510 may include the second plate 1511 which at least partially includes a metallic material and a side member 1520 which is disposed along the peripheral edge of the second plate 1511 to have a predetermined height. According to one embodiment, the second plate 1511 may be formed integrally with the side member 1520. The side member 1520 (e.g., the side member 310 of FIG. 3B) includes a first side face, a second side face 1522, a third side face 1523, and a fourth side face 1524. The third side face 1523 may include a fourth conductive portion 15231, a third non-conductive portion 15232, a fifth conductive portion 15233, a fourth non-conductive portion 15234, and a sixth conductive portion 15235, which are sequentially disposed between the second side face 1522 and the fourth side face 1524. The second plate 1511 may include the second non-conductive slit 15236, which surrounds a third conductive region 15111 together with the fifth conductive portion 15213 when viewed from the upper side of the second plate 1511 and extends from the third non-conductive portion 15232 to the fourth non-conductive portion 15234. The second plate 1511 is divided, by the second non-conductive slit 15236, into a third conductive region 15111 that operates as an antenna radiator and a second conductive region 15112 that operates as a ground. The distance between the second non-conductive slit 15236 and the third side face 1523 may be defined according to the radiation characteristic of a desired antenna.

Referring to FIG. 15B, the board 1530 may include a main ground plane 1531 and a ground extension 1532 disposed between the third conductive region 15111 of the second plate 1511 and the third side face 1523. The ground extension 1532 may extend from the main ground plane 1531 in an L shape. The ground extension 1532 may include a first portion 15321 extending from the main ground plane 1531 toward the third side face 1523 and a second portion 15322 extending from the first portion 15321 toward the fourth side face 1524. The board 1530 may include a board slit 1534 having a predetermined length and a predetermined width, which are formed by the main ground plane 1531 and the second portion 15322.

According to an embodiment of the present disclosure, the second portion 15322 may be electrically connected to a first electrical connector 15323 mounted in the second portion 15233 via a first communication circuit 1540 (e.g., a first power feeding portion) disposed on the board 1530. The second portion 15322 may be electrically connected to the first electrical connector 15323 via the communication circuitry 1540 and across the board slit 1534. When the housing 1510 is coupled to the board 1530, the first electrical connector 15323 may be electrically connected to the first contact point CP1 of the housing 1510.

According to an embodiment of the present disclosure, the board 1530 may include a fill-cut region 1533, which is a non-conductive region. The fill-cut region 1533 may be formed in a region of the board 1530 that overlaps with a partial region of the second conductive region 15112 of the housing 1510. However, without being limited thereto, the fill-cut region 1533 may be disposed at various positions where a margin space for the board 1530 is allowed. A second electrical connector 15331, which is electrically connected via a second communication circuit 1541 (e.g., a second power feeding portion), may be mounted on the fill-cut region 1533 of the board 1530. The second electrical connector 15331 can be electrically connected to a second contact point CP2 disposed at a corresponding position in the second conductive area 15112 of the housing 1510 to be mounted by coming into physical contact with the second contact point CP2.

According to an embodiment of the present disclosure, a third electrical connector 15311 may be mounted in place of the main ground plane 1531 of the board 1530, and may be electrically connected to the housing 1510 via a first ground point GP1 disposed at a corresponding position in the housing 1510. A fourth electrical connector 15324 may be mounted in place of a ground extension 1532 of the board 1530, and may be electrically connected to the housing 1510 via a second ground point GP2 disposed at a corresponding position in the housing 1510. At least one element 1551 (e.g., a finite element microstrip (FEM)) formed of a conductive member may be mounted on the second portion 15322.

According to an embodiment of the present disclosure, the second non-conductive slit 15236 of the housing 1510 may include a metal bridge 15113 formed to electrically connect the third conductive region 15111 and the second conductive region 15112 of the second plate 1511. The metal bridge 15113 may perform an isolation function for excluding mutual interference between a slit antenna region having a first radiation current path (path ⑩) illustrated by the first communication circuit 1540 and an antenna region having a second radiation current path (path ⑪) illustrated by the second communication circuit 1541.

According to an embodiment of the present disclosure, the metal bridge 15113 may be disposed on an imaginary straight line interconnecting the first ground point GP1 and the second ground point GP2 in order to enhance the isolation function. An antenna in an antenna region having the first radiation current path may operate in the low band and mid band, and an antenna in an antenna region having the second radiation current path may operate in the high band.

Figure 16A:
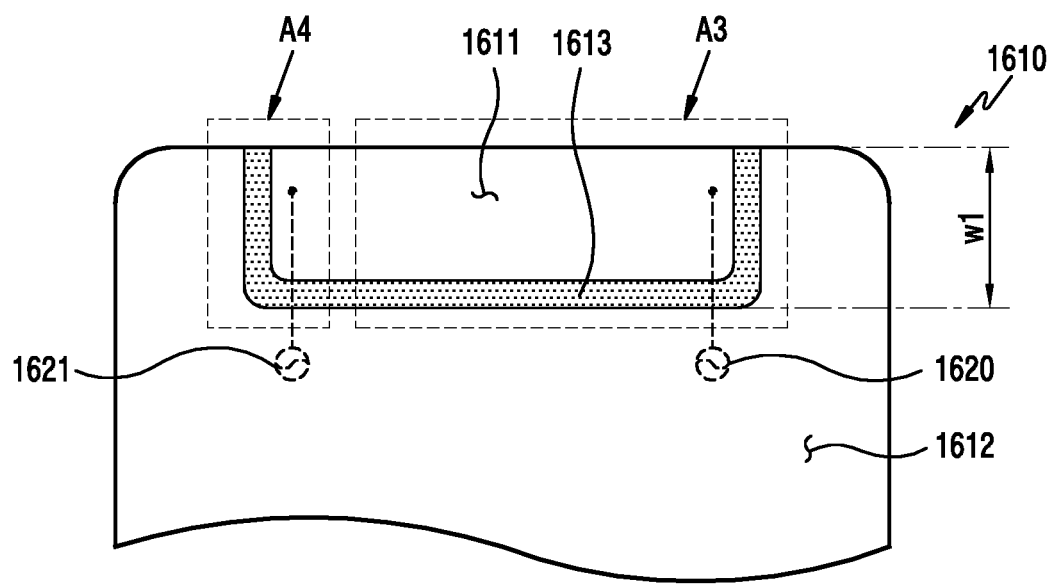
FIGS. 16A and 16B are views each illustrating a configuration of an antenna according to a distance from a non-conductive slit according to an embodiment of the present disclosure to a side face.
Figure 16B:
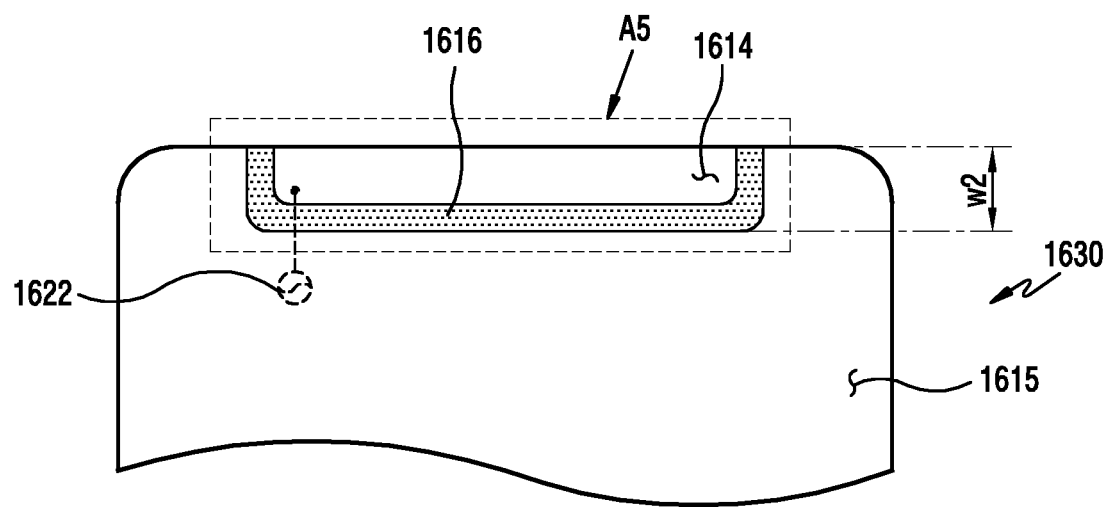

FIGS. 16A and 16B are views each illustrating a configuration of an antenna according to a distance from a non-conductive slit according to an embodiment of the present disclosure to a side face.

Referring to FIGS. 16A and 16B, a housing 1610 and 1630 may be similar to the housing 4001 of FIG. 4, or may include another embodiment of the housing.

The housing 1610 may include a first non-conductive slit 1613 formed similarly to the non-conductive slits of FIG. 4 (e.g., the non-conductive slits 4116 and 4136 of FIG. 4). According to one embodiment, the first non-conductive slit 1613 may divide the housing 1610 at least partially including a metallic material into a first conductive region 1611 and a second conductive region 1612.

According to an embodiment of the present disclosure, the first conductive region 1611, which is formed to have a predetermined area and to be independent by the first non-conductive slit 1613, is electrically connected by one or more communication circuits 1620 and 1621 (e.g., a power feeding portion), so that the first conductive region 1611 can operate as an antenna for various operating frequency bands. The first communication circuit 1621 may be electrically connected to at least a part of the first conductive region 1611 of the housing 1610 via a first electrical connector (e.g., the first electrical connector 15323 of FIG. 15B). The second communication circuit 1620 may be electrically connected to another part of the first conductive region 1611 of the housing 1610 via a second electrical connector (e.g., the second electrical connector 15331 of FIG. 15B). When the width W1 in the lateral direction of the first conductive region 1611 is sufficiently large, region A3, which is electrically connected by the first communication circuit 1620 in the first conductive regions 1611, may serve as a multi-band antenna, which operates in the low and mid bands as described above. Region A4 electrically connected by the second communication circuit 1621 in the first conductive region 1611 may also operate as another antenna radiator. The antenna may operate as an antenna as a slit structure of an inner PCB and the housing are electrically connected together.

Referring to FIG. 16B, the housing 1630 may include a second non-conductive slit 1616 formed similarly to the non-conductive slits of FIG. 4 (e.g., the non-conductive slits 4116 and 4136 of FIG. 4). According to one embodiment, the second non-conductive slit 1616 may divide the housing 1630 at least partially including a metallic material into a first conductive region 1614 and a second conductive region 1615.

According to an embodiment of the present disclosure, when the first conductive region 1614, which is formed to have a predetermined area and to be independent by the second non-conductive slit 1616, has a relatively small width W2, the first conductive region 1614 may be electrically connected by the third communication circuit 1622, and may serve as an IFA, which is utilized as an outer pattern of a MDA in region A5.

Figure 17A:
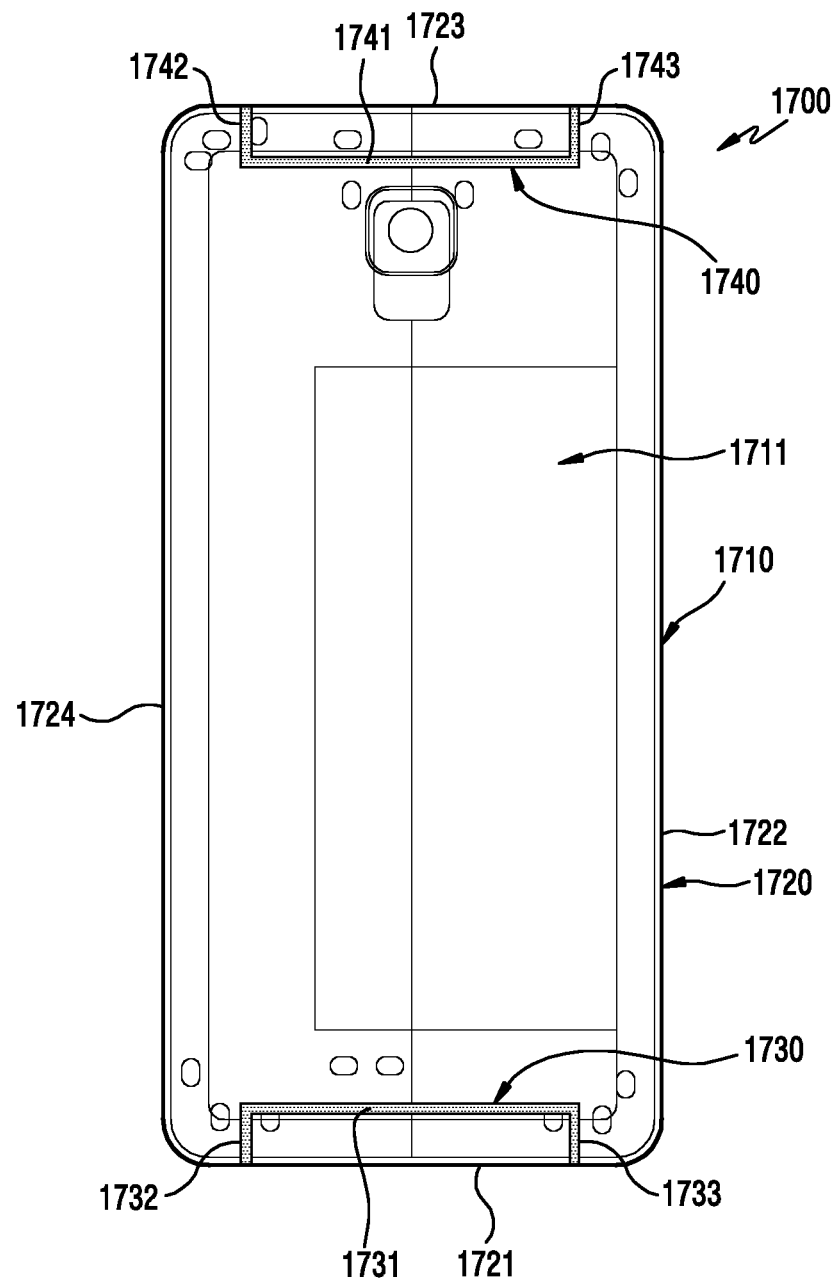
FIGS. 17A, 17B, and 17C are views illustrating an electronic device including various shapes of non-conductive slits according to an embodiment of the present disclosure.
Figure 17B:
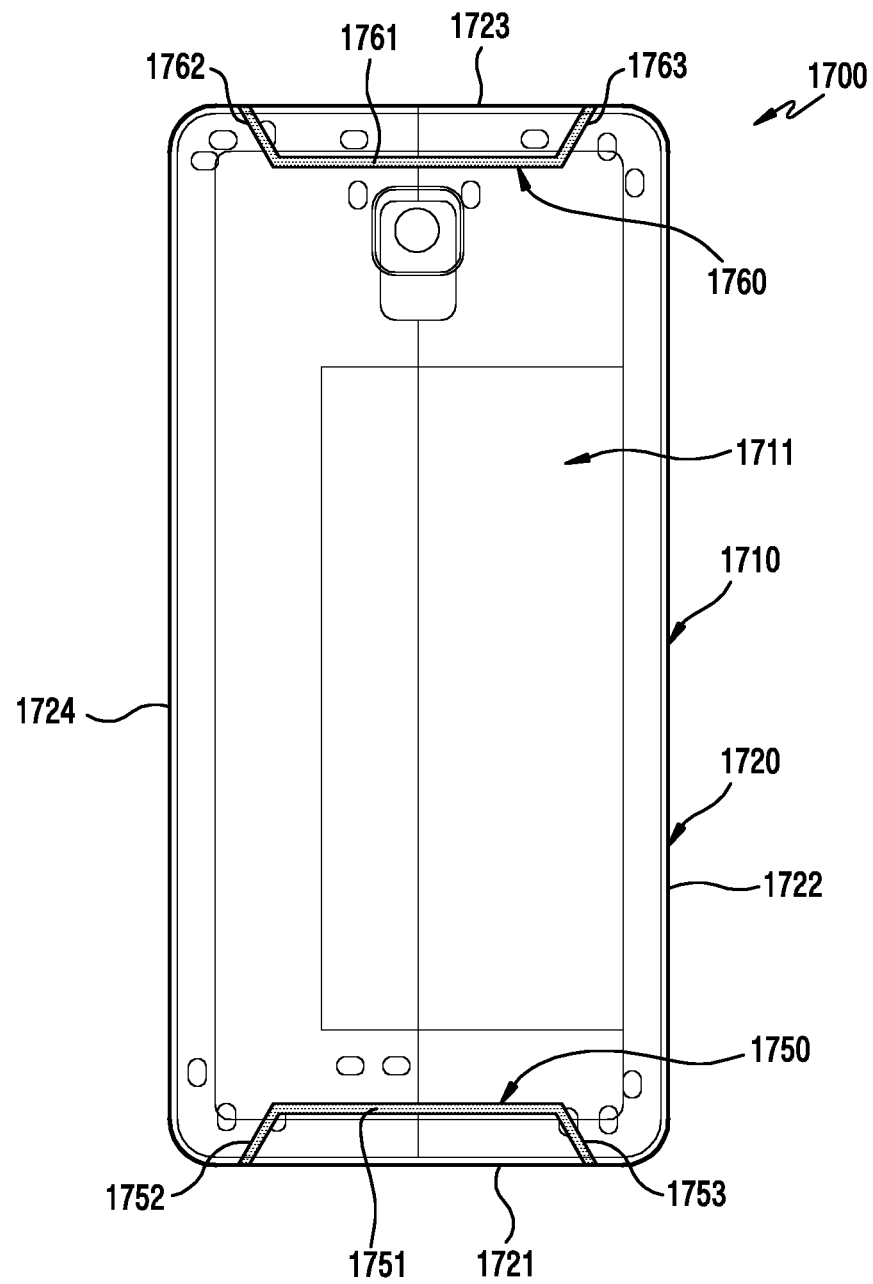
Figure 17C:
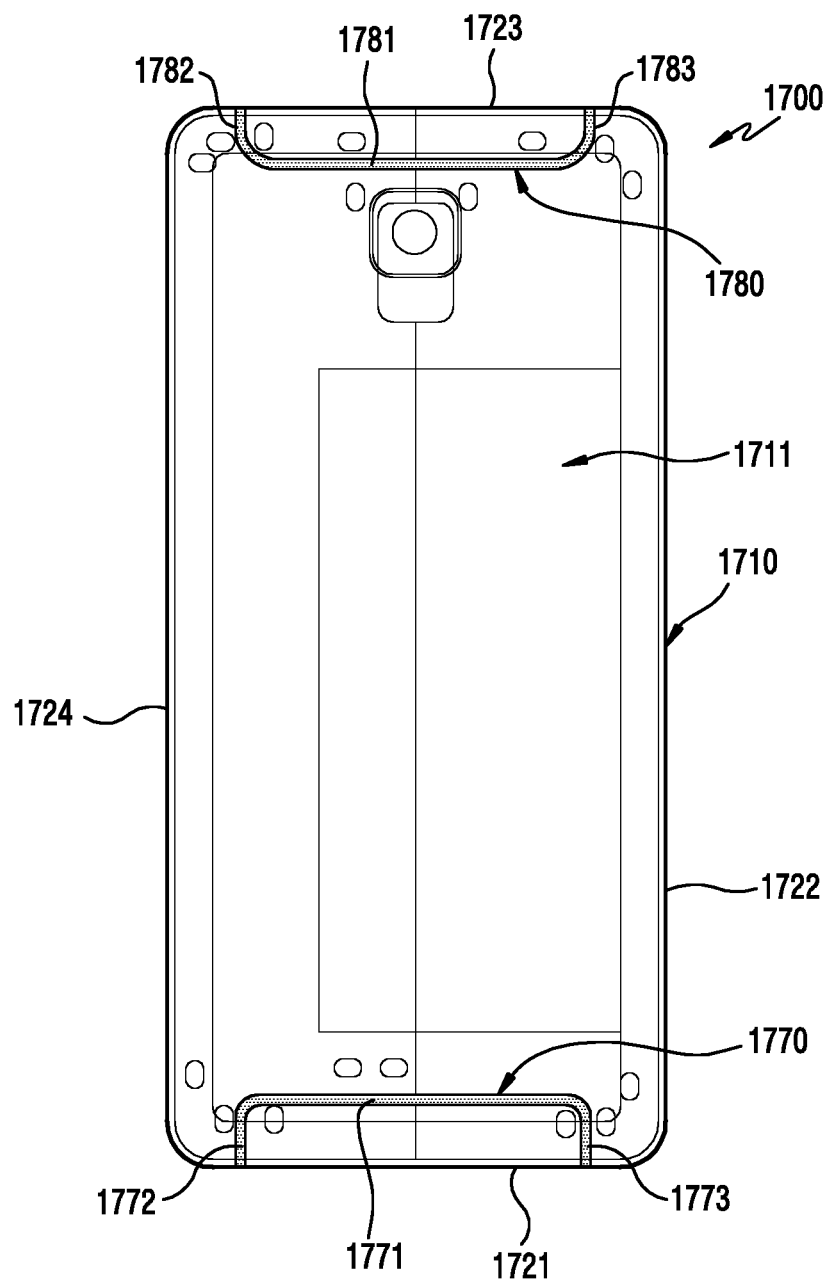

FIGS. 17A, 17B, and 17C are views illustrating an electronic device 1700 including various shapes of non-conductive slits according to an embodiment of the present disclosure.

Referring to FIG. 17A, the electronic device 1700 (e.g., the electronic device 101 of FIG. 1, the electronic device 201 of FIG. 2, or the electronic device 300 of FIG. 3A) may include a housing 1710, which may at least partially include a metallic material. According to one embodiment, the housing 1710 may include a first plate, a second plate 1711 spaced apart from the first plate and directed in an opposite direction, and a side member 1720 that is disposed to at least partially surround a space between the first plate and the second plate 1711. The first plate, the second plate 1711, and the side member 1720 may be formed integrally.

According to an embodiment of the present disclosure, the side member 1720 (e.g., the side member 310 of FIG. 3B) may include a first side face 1721, a second side face 1722, a third side face 1723, and a fourth side face 1724. The second plate 1711 includes a first non-conductive slit 1730 and a second non-conductive slit 1740, in which slit portions 1731 and 1741 may be formed in a direction parallel to a first side face 1721 and a third side face 1723, respectively. The first non-conductive slit 1730 may include a first non-conductive extension 1732 and a second non-conductive extension 1733 which extend from the opposite ends of the slit portion 1731 to the first side face 1721. The second non-conductive slit 1740 may include a third non-conductive extension 1742 and a fourth non-conductive extension 1743 which extend from the opposite ends of the slit portion 1741 to the third side face 1723. The first non-conductive extension 1732 and the second non-conductive extension 1733 extend in parallel with the second side face 1722 and the fourth side face 1724 (e.g., vertically from the slit 1731 toward the first side face 1721). The third non-conductive extension 1743 and the fourth non-conductive extension 1744 extend in parallel with the second side face 1722 and the fourth side face 1724 (e.g., vertically from the slit 1741 toward the first side face 1723).

Referring to FIG. 17B, in a configuration similar to the housing 1710 of FIG. 17A, a first non-conductive extension 1752 and a second non-conductive extension 1753 of the first non-conductive slit 1750 may be formed in linear shapes that are inclined from the ends of the slit portion 1751 toward the second side face 1722 and the fourth side face 1724, respectively. According to one embodiment, a third non-conductive extension 1762 and a fourth non-conductive extension 1763 of the second non-conductive slit 1760 may be formed in linear shapes that are inclined from the ends of the slit portion 1761 toward the second side face 1722 and the fourth side face 1724, respectively.

Referring to FIG. 17C, in a configuration similar to the housing 1710 of FIG. 17A, a first non-conductive extension 1772 and a second non-conductive extension 1773 of the first non-conductive slit 1770 may be formed in parallel with the second side face 1722 and the fourth side face 1724 (e.g., vertically from the ends of the slit portion 1771 toward the first side face 1721) and each bent portion may be formed in a curved shape. According to one embodiment, a third non-conductive extension 1782 and a fourth non-conductive extension 1783 of the second non-conductive slit 1780 may be formed in parallel with the second side face 1722 and the fourth side face 1724 (e.g., vertically from the ends of the slit portion 1781 toward the third side face 1723) and each bent portion may be formed in a curved shape.

According to an embodiment of the present disclosure, one or more of the above-mentioned non-conductive slits 1730, 1740, 1750, 1760, 1770, and 1780 may be formed in the same shape in one housing 1710, or a plurality of the non-conductive slits may be formed in different shapes in one housing 1710.

According to an embodiment of the present disclosure, an antenna device may operate smoothly in multiple frequency bands when the shape of a non-conductive slit disposed in a metal housing is changed and operates in conjunction with a board slit, a partial region of which overlaps the non-conductive slit, and radiation performance can be suppressed from deteriorating when a hand effect occurs at the time of gripping the electronic device.

According to an embodiment of the present disclosure, it is possible to provide an electronic device including a housing including a first plate, a second plate facing away from the first plate, and a side member surrounding a space between the first plate and the second plate, in which the side member includes a first side face extending in a first direction and having a first length, a second side face extending in a second direction perpendicular to the first direction and having a second length longer than the first length, a third side face extending parallel to the first side face and having the first length, and a fourth side face extending parallel to the second side face and having the second length, in which the first side face includes a first conductive portion, a first non-conductive portion, a second conductive portion, a second non-conductive portion, and a third conductive portion sequentially disposed between the second side face and the fourth side face, and in which the second plate is formed of a conductive material, and includes a non-conductive slit surrounding the first conductive region together with the second conductive portion when viewed from an upper side of the second plate, the non-conductive slit extending from the first non-conductive portion to the second non-conductive portion; a touch screen display disposed within the housing, and exposed through a portion of the first plate; a PCB disposed between the first plate and the second plate to be parallel to the second plate, in which the PCB includes a main ground plane and a first L-shaped ground extension disposed between the first conductive region of the second plate and the first plate, and the first L-shaped ground extension comprises a first portion extending generally in the second direction from the main ground plane and a second portion extending generally in the first direction from the first portion; and at least one first wireless communication circuit disposed on the PCB and electrically connected to a first point in the second portion of the first L-shaped ground extension.

According to an embodiment of the present disclosure, the side member and the second plate may be formed integrally.

According to an embodiment of the present disclosure, the electronic device may further include a first flexible conductive member electrically connected to a second point which is closer to the first side face than the first point on the second portion of the first L-shaped ground extension.

According to an embodiment of the present disclosure, the electronic device may further include an electrical connector mounted on the second portion of the first L-shaped ground extension.

According to an embodiment of the present disclosure, the electronic device may further include a plurality of flexible conductive members electrically connected between the main ground plane and the second conductive region of the second plate, in which the second conductive region may be positioned outside the first conductive region with the non-conductive slit being interposed therebetween.

According to an embodiment of the present disclosure, the plurality of flexible conductive members may include a second flexible conductive member and a third flexible conductive member that are aligned in the first direction when viewed from the upper side of the second plate.

According to an embodiment of the present disclosure, the at least one wireless communication circuit may provide a radio signal having a frequency ranging from 0.7 GHz to 2.7 GHz.

According to an embodiment of the present disclosure, the third side face may include a fourth conductive portion, a third non-conductive portion, a fifth conductive portion, a fourth non-conductive portion, and a sixth conductive portion sequentially disposed between the second side face and the fourth side face. The second plate may include a second non-conductive slit surrounding the third conductive region together with the fifth conductive portion when viewed from the upper side of the second plate, the second non-conductive slit extending from the fourth non-conductive portion to the sixth non-conductive portion. The PCB may include a main ground plane and a second L-shaped ground extension disposed between the third conductive region of the second plate and the first plate, and the second L-shaped ground extension comprises a third portion extending generally in the second direction from the main ground plane and a fourth portion extending generally in the first direction from the third portion. The electronic device may further include at least one second wireless communication circuit disposed on the PCB and electrically connected to the third portion of the second L-shaped ground extension.

According to an embodiment of the present disclosure, the second plate may include a metal bridge that traverses across the second non-conductive slit in a direction from the third conductive region toward the second conductive region.

According to an embodiment of the present disclosure, the PCB may further include a non-conductive fill-cut region, and the electronic device may further include a third wireless communication circuit electrically connected to an electrically connected mounted in the fill-cut region.

According to an embodiment of the present disclosure, when the housing is coupled with the PCB, the second wireless communication circuit may be electrically connected to a first contact point in the third conductive region of the housing, and the third wireless communication circuit may be electrically connected to a second contact point in the third conductive region of the housing.

According to an embodiment of the present disclosure, the first contact point and the second contact point may be divisionally disposed by an imaginary line formed in parallel with the second direction from the metal bridge toward the third side face.

According to an embodiment of the present disclosure, the electronic device may further at least one ground point disposed on the imaginary line and electrically connected to the housing coupled to the PCB.

According to an embodiment of the present disclosure, the first wireless communication circuit may be electrically connected to a third point spaced apart from the first point in the first L-shaped ground extension as well as the first point.

According to an embodiment of the present disclosure, the electronic device may further a switching device configured to selectively connect the second portion of the first L-shaped ground extension and the main ground plane, and the electrical length of a slit formed by the second portion of the first L-shaped ground extension and the main ground plane is changed according to an operation of the switching device.

According to an embodiment of the present disclosure, the electronic device may further include a switching device installed in the second portion of the L-shaped ground extension at a position other than the second point and selectively electively connected to the housing, and an electrical length by the second point of the first L-shaped ground extension is changed according to an operation of the switching device.

According to an embodiment of the present disclosure, the electronic device may further include at least one electronic component that is mounted on the first L-shaped ground extension and at least partially includes a metallic material.

According to an embodiment of the present disclosure, the at least one electronic component may include at least one of an interface connector port, an ear-jack assembly, a speaker device, a microphone device, a camera device, and various sensor modules.

According to an embodiment of the present disclosure, a slit formed by the second portion of the first L-shaped ground extension of the PCB may be disposed at a position where the slit at least partially overlaps the first non-conductive slit of the housing when the PCB and the housing are coupled with each other.

According to an embodiment of the present disclosure, the PCB and the housing may be electrically connected via an electrical connector or a flexible conductive member interposed therebetween, and the electrical connector or the flexible conductive member may have at least one of a C-clip, a conductive tape, and a conductive pad.

The embodiments of the present disclosure disclosed in the present disclosure and the accompanying drawings are only examples proposed in order to easily describe the present disclosure and help with comprehension of the present disclosure, but are not intended to limit the scope of the present disclosure. Therefore, in addition to the embodiments disclosed herein, the scope of the present disclosure should be construed to include all modifications or modified forms drawn based on the technical idea of the various embodiments of the present disclosure, as defined by the appended claims and their equivalents.

What is claimed is:

1. An electronic device, comprising:
   a housing comprising a first plate, a second plate facing away from the first plate, and a side member surrounding a space between the first plate and the second plate,
   wherein the side member comprises a first conductive portion, a first non-conductive portion, a second conductive portion, a second non-conductive portion, and a third conductive portion sequentially disposed, and
   wherein the second plate is formed of a conductive material, and comprises a non-conductive slit surrounding a first conductive region together with the second conductive portion when viewed from an upper side of the second plate, the non-conductive slit extending from the first non-conductive portion to the second non-conductive portion;
   a touch screen display disposed within the housing, and exposed through a portion of the first plate;
   a printed circuit board (PCB) disposed between the first plate and the second plate, wherein the PCB comprises a main ground plane and a first L-shaped ground extension disposed between the first conductive region of the second plate and the first plate, and the first L-shaped ground extension comprises a first portion extending generally in a second direction from the main ground plane and a second portion extending generally in a first direction perpendicular to the second direction from the first portion;
   at least one first wireless communication circuit disposed on the PCB and electrically connected to a first point in the second portion of the first L-shaped ground extension; and
   a first switching device configured to change an electrical length of a slit formed by the second portion of the first L-shaped ground extension and the main ground plane by selectively connecting the second portion of the first L-shaped ground extension and the main ground plane,
   wherein the second plate comprises a first metal bridge that traverses the non-conductive slit from the first conductive region to a second conductive region.
   wherein the second conductive region is positioned outside the first conductive region with the non-conductive slit being interposed therebetween
   wherein the PCB is electrically connected to the housing through a first contact point and a second contact point in the first conductive region of the housing, and
   wherein the first metal bridge is disposed on an imaginary line connecting the first contact point and the second contact point.

2. The electronic device of claim 1, wherein the side member and the second plate are formed integrally.

3. The electronic device of claim 1, further comprising:
   a first flexible conductive member electrically connected to a second point which is closer to a first side face of the side member extending in the first direction than the first point on the second portion of the first L-shaped ground extension.

4. The electronic device of claim 3, further comprising:
   a second switching device installed in the second portion of the L-shaped ground extension at a position other than the second point and selectively electively connected to the housing, and
   an electrical length by the second point of the first L-shaped ground extension is changed according to an operation of the second switching device.

5. The electronic device of claim 1, further comprising:
   an electrical connector mounted on the second portion of the first L-shaped ground extension.

6. The electronic device of claim 1, further comprising:
   a plurality of flexible conductive members electrically connected between the main ground plane and the second conductive region of the second plate.

7. The electronic device of claim 5, wherein the plurality of flexible conductive members comprises a second flexible conductive member and a third flexible conductive member that are aligned in the first direction when viewed from the upper side of the second plate.

8. The electronic device of claim 1, wherein the at least one wireless communication circuit is configured to provide a radio signal having a frequency ranging from 0.7 GHz to 2.7 GHz.

9. The electronic device of claim 1, wherein the side member further comprises a fourth conductive portion, a third non-conductive portion, a fifth conductive portion, a fourth non-conductive portion, and a sixth conductive portion,
   wherein the second plate includes a second non-conductive slit surrounding a third conductive region together with the fifth conductive portion when viewed from the upper side of the second plate, and the second non-conductive slit extends from the fourth non-conductive portion to the sixth non-conductive portion,
   wherein the PCB comprises a main ground plane and a second L-shaped ground extension disposed between the third conductive region of the second plate and the first plate, and the second L-shaped ground extension comprises a third portion extending generally in the second direction from the main ground plane and a fourth portion extending generally in the first direction from the third portion, and
   wherein the electronic device further comprises at least one second wireless communication circuit disposed on the PCB and electrically connected to the third portion of the second L-shaped ground extension.

10. The electronic device of claim 9, wherein the second plate comprises a second metal bridge that traverses the second non-conductive slit from the second conductive region toward the third conductive region.

11. The electronic device of claim 10, wherein the PCB further comprises a non-conductive fill-cut region, and
    the electronic device further comprises a third wireless communication circuit electrically connected to an electrical connector mounted in the fill-cut region.

12. The electronic device of claim 11, wherein, when the housing is coupled with the PCB, the second wireless communication circuit is electrically connected to a third contact point in the third conductive region of the housing, and the third wireless communication circuit is electrically connected to a fourth contact point in the third conductive region of the housing.

13. The electronic device of claim 11, wherein the third contact point and the fourth contact point are divisionally disposed by an imaginary line formed in parallel with the second direction from the second metal bridge toward a third side face of the side member extending in the first direction.

14. The electronic device of claim 13, further comprising:
at least one ground point disposed on the imaginary line and electrically connected to the housing coupled to the PCB.

15. The electronic device of claim 1, wherein the first wireless communication circuit is electrically connected to a third point spaced apart from the first point in the first L-shaped ground extension as well as the first point.

16. The electronic device of claim 1, further comprising:
at least one electronic component that is mounted on the first L-shaped ground extension and at least partially includes a metallic material.

17. The electronic device of claim 16, wherein the at least one electronic component comprises at least one of an interface connector port, an ear-jack assembly, a speaker device, a microphone device, a camera device, and sensor modules.

18. The electronic device of claim 1, wherein a slit formed by the second portion of the first L-shaped ground extension of the PCB is disposed at a position where the slit at least partially overlaps the first non-conductive slit of the housing when the PCB and the housing are coupled with each other.

19. The electronic device of claim 1, wherein the PCB and the housing are electrically connected via an electrical connector or a flexible conductive member interposed therebetween, and the electrical connector or the flexible conductive member has at least one of a C-clip, a conductive tape, and a conductive pad.

* * * * *